(12) United States Patent
Miura

(10) Patent No.: US 7,049,890 B2
(45) Date of Patent: May 23, 2006

(54) OPERATIONAL AMPLIFIER WITH SELF CONTROL CIRCUIT FOR REALIZING HIGH SLEW RATE THROUGHOUT FULL OPERATING RANGE

(75) Inventor: Makoto Miura, Yamagata (JP)

(73) Assignee: NEC Electronics Corporation, Kanagawa (JP)

( * ) Notice: Subject to any disclaimer, the term of this patent is extended or adjusted under 35 U.S.C. 154(b) by 115 days.

(21) Appl. No.: 11/099,487

(22) Filed: Apr. 6, 2005

(65) Prior Publication Data

US 2005/0168284 A1 Aug. 4, 2005

Related U.S. Application Data

(62) Division of application No. 10/671,797, filed on Sep. 29, 2003.

(30) Foreign Application Priority Data

Oct. 1, 2002 (JP) .............................. 2002-289073

(51) Int. Cl.
*H03F 3/45* (2006.01)
(52) U.S. Cl. ..................................... 330/255; 330/253
(58) Field of Classification Search ................ 330/255, 330/253, 257, 261; 327/359
See application file for complete search history.

(56) References Cited

U.S. PATENT DOCUMENTS

| 5,831,480 | A | * | 11/1998 | Kato et al. .................... 330/253 |
| 5,907,259 | A | * | 5/1999 | Yamada et al. ............. 327/563 |
| 6,005,440 | A | * | 12/1999 | Okamoto ..................... 330/253 |

FOREIGN PATENT DOCUMENTS

| JP | H07-106872 A | 4/1995 |
| JP | H07-321570 A | 12/1995 |
| JP | H09-232883 A | 9/1997 |
| JP | H11-088076 A | 3/1999 |
| JP | 2000-295044 A | 10/2000 |
| JP | 2001-004974 A | 1/2001 |

* cited by examiner

*Primary Examiner*—Henry Choe
(74) *Attorney, Agent, or Firm*—Sughrue Mion, PLLC

(57) ABSTRACT

An operational amplifier comprises: differential input stages to which differential signals can be inputted with full operating range; current source circuits coupled to determine current values of the differential input stages, phase inverter circuits which are provided between transistors of an output stage circuit and the current source circuits; a driver stage circuit and the output stage circuit. The phase inverter circuits control currents of the current source circuits depending on the output signal potential level. By using this structure, it becomes possible to realize a high slew rate throughout the full operating range.

8 Claims, 21 Drawing Sheets

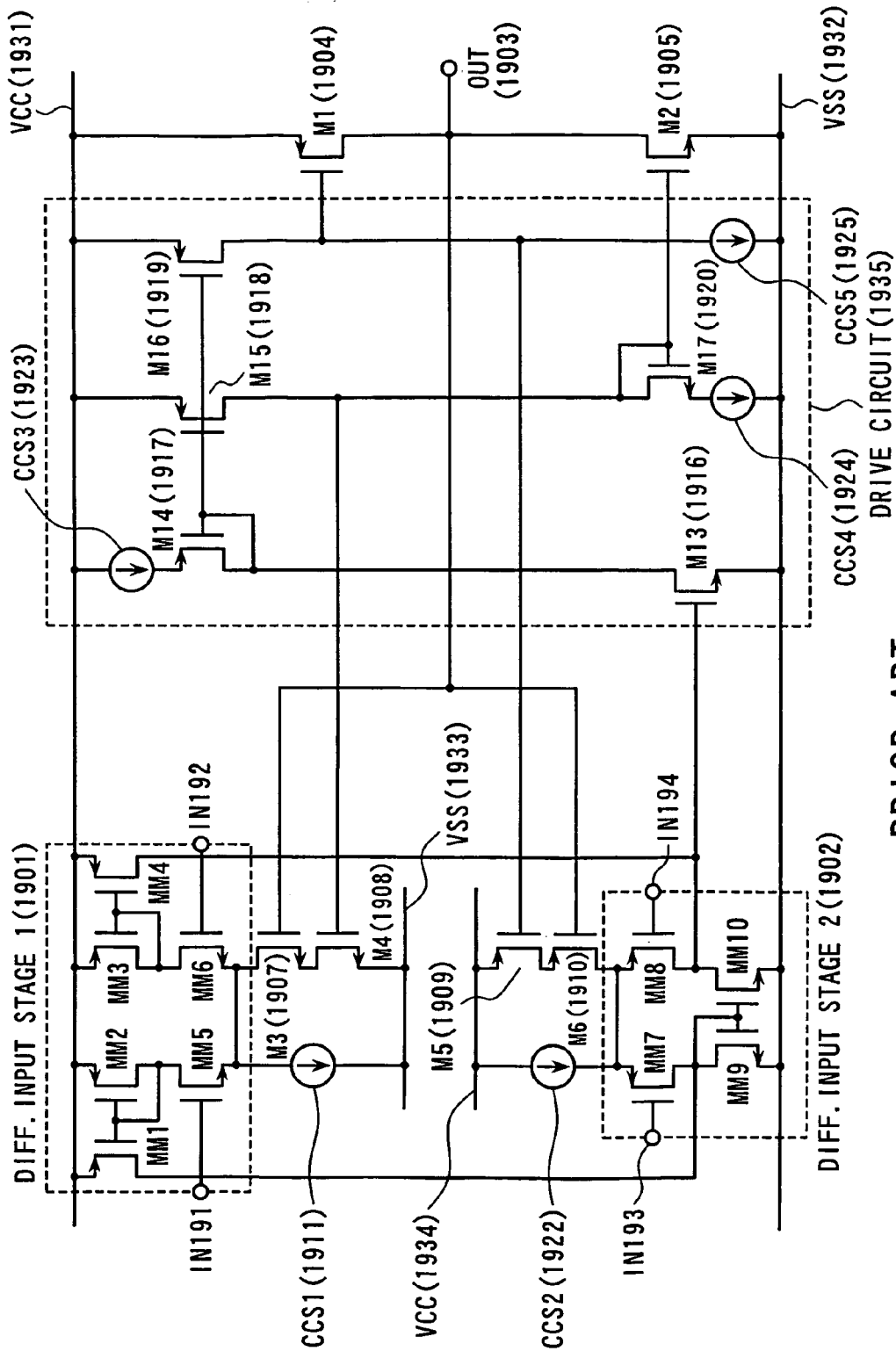

FIG. 20A

UNIT: μA

| SIMULATION RESULT | STATIC CURRENT VALUE |
|---|---|
| INVENTION | 23.202 |
| PRIOR ART | 20.786 |

11.6% INCREASE

AMPLITUDE (V)
VCC=4.0V  3.8-0.2
VCC=4.6V  4.4-0.2
VCC=5.0V  4.8-0.2

FIG. 20B

| SIMULATION RESULT | OPERATING CURRENT VALUE (μA) | | |
|---|---|---|---|
| | VCC=4.0V, Ta=85°C, Vt=H | VCC=4.6V, Ta=25°C, Vt=C | VCC=5.0V, Ta=−40°C, Vt=L |
| INVENTION | 26.987 | 39.848 | 57.383 |
| PRIOR ART | 24.593 | 35.504 | 50.744 |
| | 9.7% INCREASE | 12.2% INCREASE | 13.1% INCREASE |

FIG. 20C

| SIMULATION RESULT | SETTLING TIME (μs) | | | | | |
|---|---|---|---|---|---|---|
| | VCC=4.0V, Ta=85°C, Vt=H | | VCC=4.6V, Ta=25°C, Vt=C | | VCC=5.0V, Ta=−40°C, Vt=L | |
| UP or DW | SUT | SDT | SUT | SDT | SUT | SDT |
| INVENTION | 0.840 | 0.870 | 0.570 | 0.630 | 0.400 | 0.460 |
| PRIOR ART | 1.490 | 1.570 | 0.880 | 0.910 | 0.590 | 0.570 |
| | 43% DECREASE | 45% DECREASE | 35% DECREASE | 30% DECREASE | 32% DECREASE | 20% DECREASE |

COMPARISON UNDER WORST SETTLING TIME

OPERATIONAL AMPLIFIER WITH SELF CONTROL CIRCUIT FOR REALIZING HIGH SLEW RATE THROUGHOUT FULL OPERATING RANGE

This is a divisional of application Ser. No. 10/671,797 filed Sep. 29, 2003, the entire disclosure of which is considered part of the disclosure of the accompanying application and is hereby incorporated by reference.

FIELD OF THE INVENTION

The present invention relates generally to an operational amplifier, and more particularly to an operational amplifier having wide input/output signal ranges and capable of driving a heavy load with high slew rate.

BACKGROUND OF THE INVENTION

With reference to the drawing, an explanation will be made on a conventional operational amplifier. As shown in FIG. 19, the conventional operational amplifier comprises: a differential input stage 1 (1901) which receives differential input signals at a differential input terminal (IN191) and a differential input terminal (IN192); a differential input stage 2 (1902) which receives differential input signals at a differential input terminal (IN193) and a differential input terminal (IN194); a constant current source 1 (CCS1) (1911) which is coupled between the differential input stage 1 (1901) and the ground; a constant current source 2 (CCS2) (1922) which is coupled between the differential input stage 2 (1902) and a power source; an output terminal (OUT) (1903) for outputting an output signal of the operational amplifier; P-channel FET M1 (1904) whose source electrode is coupled with a power source VCC (1931), whose drain electrode is coupled with the output terminal (1903), and which sources an output current to a load (not shown in the drawing) coupled via the output terminal (1903); and N-channel FET M2 (1905) whose source electrode is coupled with the ground power source VSS (1932), whose drain electrode is coupled with the output terminal (1903), and which sinks an output current from the load (not shown in the drawing) coupled via the output terminal (1903).

The conventional operational amplifier shown in FIG. 19 further comprises: an N channel FET M3 (1907) whose drain electrode is coupled with the differential input stage 1 (1901), whose gate electrode is coupled with the output terminal (1903), and which controls the differential input stage 1 (1901) in response to the output signal level of the output terminal (1903); an N channel FET M4 (1908) whose drain electrode is coupled with the source electrode of the N channel FET M3 (1907), whose gate electrode receives a first control signal of a driver stage circuit (1935), and whose source electrode is coupled with the ground power source VSS (1933); a P-channel FET M5 (1909) whose source electrode is coupled with the power source VCC (1934), whose gate electrode receives a second control signal of the driver stage circuit (1935), and which, in response to an output potential level of the output terminal (1903), controls the differential input stage 2 (1902); and a P-channel FET M6 (1910) whose drain electrode is coupled with the differential input stage 2 (1902), whose source electrode is coupled with the drain electrode of the P-channel FET M5 (1909), and whose gate electrode is coupled with the output terminal (1903).

Also, the differential input stage 1 (1901) comprises a differential transistor pair of well known technology and a current mirror circuit of well known technology, and the differential input stage 2 (1902) comprises a differential transistor pair of well known technology and a load circuit of well known technology.

That is, the differential input stage 1 (1901) comprises a first differential transistor pair (MM5, MM6) wherein one gate electrode is coupled with the differential input terminal (IN191) and the other gate electrode is coupled with the differential input terminal (IN192); a first current mirror circuit (M1, MM2) which is coupled between the output terminal on the negative signal side of the first differential transistor pair (MM5, MM6) and the high potential power supply conductor VCC (1931); and a second current mirror circuit (MM3, MM4) which is coupled between the output terminal on the positive signal side of the first differential transistor pair (MM5, MM6) and the high potential power supply conductor VCC (1931).

Also, the differential input stage 2 (1902) comprises: a second differential transistor pair (MM7, MM8) wherein one gate electrode is coupled with the differential input terminal (IN193) and the other gate electrode is coupled with the differential input terminal (IN194); and a load circuit (MM9, MM10) which is coupled between the second differential transistor pair (MM7, MM8) and the low potential power supply conductor VSS (1932).

Next, with reference again to FIG. 19, an operation of the conventional operational amplifier will be briefly explained. When, in the conventional operational amplifier, signals are applied to the differential input stage 1 (1901) and the differential input stage 2 (1902) so as to raise the potential of the output terminal (1903), a signal potential at the gate electrode of the P-channel FET M1 (1904) and a signal potential at the gate electrode of the N-channel FET M2 (1905) fall, and these signals are inputted to the gate electrodes of the P-channel FET M5 (1909) and the N-channel FET M4 (1908), respectively.

In this case, to the gate electrode of the P-channel FET M5 (1909), the fallen gate signal of the P-channel FET M1 (1904) is inputted, and a current flowing through the differential input stage 2 (1902) increases, thereby, a high slew rate can be obtained.

On the other hand, in the conventional operational amplifier, when signals are applied to the differential input stage 1 (1901) and the differential input stage 2 (1902) so as to lower the potential of the output terminal (1903), a signal potential at the gate electrode of the P-channel FET M1 (1904) and a signal potential at the gate electrode of the N-channel FET M2 (1905) rise, and these signals are inputted to the gate electrodes of the P-channel FET M5 (1909) and the N-channel FET M4 (1908), respectively. In this case, to the gate electrode of the N-channel FET M4 (1908), the risen gate signal of the N-channel FET M2 (1905) is inputted, and a current flowing through the differential input stage 1 (1901) increases, thereby, a high slew rate can be obtained.

Such operational amplifier is described, for example, in the patent document 1 below.

[Patent Document]

Japanese patent laid-open publication No. 11-088076 (paragraph numbers [0026]–[0035], FIG. 1 and FIG. 2)

However, it is required that an operational amplifier for driving a load has a small power consumption and a high slew rate. To improve the slew rate, various technologies are proposed. For example, a technology in which a slew rate is controlled by using an external signal, and so on are proposed. However, in each of these technologies, a current value is increased even when no change exists in a data signal, or an external control circuit is additionally required. Therefore, overall performance is not so good.

Also, in a conventional technology in which an external signal for controlling a slew rate is not used but in which a self control circuit is provided within an operational amplifier to improve a slew rate, a current is increased only in one of a differential input stage which receives input signals by P-channel FET's and a differential input stage which receives input signals by N-channel FET's. Therefore, a slew rate is limited by the threshold value Vt of transistors such as transistors MM5 and MM6, and the slew rate does not become high throughout wide input/output signal ranges.

SUMMARY OF THE INVENTION

Therefore, it is an object of the present invention to provide a operational amplifier which has a self control circuit within the operational amplifier, and which provides a high slew rate throughout wide input/output signal ranges without being affected by the threshold value of transistors.

It is another object of the present invention to obviate the disadvantages of the conventional operational amplifiers.

According to a general aspect of the present invention, an operational amplifier of the present invention is characterized by comprising differential input stages to which signals can be inputted with full operating ranges, current source circuits which determine current values of the differential input stages, phase inverter circuits which control the current source circuits, a driver stage and an output stage, wherein the phase inverter circuits are connected between the transistors of the output stage and the current source circuits.

That is, according an aspect of the present invention, there is provided an operational amplifier comprising: a first differential transistor pair which is disposed between a first power supply conductor and a second power supply conductor, and which receives differential input signals at a first differential input terminal and a second differential input terminal thereof; a second differential transistor pair which is disposed between the first power supply conductor and the second power supply conductor, and which receives the differential input signals at a third differential input terminal and a fourth differential input terminal thereof; a first current source circuit coupled between the first differential transistor pair and the second power supply conductor; a second current source circuit coupled between the second differential transistor pair and the first power supply conductor; an output terminal for outputting an output signal; a first transistor for sourcing a drive output current via the output terminal; a second transistor for sinking a drive output current via the output terminal; an output driver stage circuit for controlling the drive output current corresponding to a signal output potential level of the output signal; a first phase inverter circuit which responds to a drive output potential level of the output driver stage circuit and which controls a circuit current of the first differential transistor pair in response to the rise or fall of the signal output potential level; and a second phase inverter circuit which responds to the drive output potential level of the output driver stage circuit and which controls a circuit current of the second differential transistor pair in response to the rise or fall of the signal output potential level.

Also, according to another aspect of the present invention, there is provided an operational amplifier comprising: a first input terminal and a second input terminal; a first differential transistor pair of a first conductivity type and a second differential transistor pair of a second conductivity type which is different from the first conductivity type, each of the second electrodes, i.e., control electrodes, of transistors of the first and second differential transistor pairs being coupled with the first input terminal or the second input terminal; a first current mirror circuit which is coupled with one output of the first differential transistor pair, with one output of the second differential transistor pair, and with a first power supply conductor; a second current mirror circuit which is coupled with the other output of the first differential transistor pair, with the other output of the second differential transistor pair, and with the first power supply conductor; a load circuit (MM9, MM10) which is coupled between the second differential transistor pair and a second power supply conductor; an output driver stage circuit which is coupled with the coupling node between the first current mirror circuit and the load circuit, and which has two drive output terminals for controlling first and second output transistors; the first transistor whose second electrode, i.e., control electrode, is coupled with one of the two drive output terminals of the output drive circuit, whose first and third electrodes are coupled with the first power supply conductor and an output terminal of the operational amplifier, respectively; the second transistor whose second electrode, i.e., control electrode is coupled with the other of the two drive output terminals of the output drive circuit, whose first and third electrodes are coupled with the second power supply conductor and the output terminal of the operational amplifier, respectively; first and second current source circuits which are coupled with the first and second differential transistor pairs, respectively, and which are controlled by the output drive signals of the output driver stage circuit; a first phase inverter circuit which responds to a drive output potential level of the output driver stage circuit and which controls a circuit current of the first differential transistor pair in response to the rise or fall of the signal output potential level; and a second phase inverter circuit which responds to the drive output potential level of the output driver stage circuit and which controls a circuit current of the second differential transistor pair in response to the fall or rise of the signal output potential level.

Further, in an operational amplifier according to the present invention, the first current source circuit may comprise: a third transistor whose second electrode, i.e., control electrode, is coupled with the first phase inverter circuit, and whose first and third electrodes are coupled with the second power supply conductor and the first differential transistor pair, respectively; and a third current source circuit which is coupled with the first differential transistor pair, the second power supply conductor, the output terminal of the operational amplifier, and the second electrode, i.e., control electrode, of the second transistor; and wherein the second current source circuit may comprise: a fourth transistor whose second electrode, i.e., control electrode, is coupled with the second phase inverter circuit, and whose first and third electrodes are coupled with the first power supply conductor and the second differential transistor pair, respectively; and a fourth current source circuit which is coupled with the second differential transistor pair, the first power supply conductor, the output terminal of the operational amplifier, and the second electrode, i.e., control electrode, of the first transistor.

By using the above-mentioned structure, the differential input stages to which signals can be inputted with full operating range comprise a differential input stage which receives input signals by P-channel FET's and a differential input stage which receives input signals by N-channel FET's. Therefore, it is possible to propagate input signal change to both of these differential input stages, and thus to obtain a high slew rate throughout full operating range.

Also, current values of the input stages are increased only at varying portions of signals, and, therefore, the present invention is effective in saving power consumption. Here, comparison results between slew rates and current values in the prior art and slew rates and current values in the present invention are shown in FIGS. 20A through FIG. 20C. Also, FIG. 21 shows comparison results of output signal waveforms of the operational amplifiers between the prior art and the present invention.

BRIEF DESCRIPTION OF THE DRAWINGS

These and other features, and advantages, of the present invention will be more clearly understood from the following detailed description taken in conjunction with the accompanying drawings, in which like reference numerals designate identical or corresponding parts throughout the figures, and in which:

FIG. 19 is a circuit diagram showing a structure of a conventional operational amplifier;

FIGS. 20A through 20C are tables showing comparison of various characteristics between the operational amplifier according to the present invention and the conventional operational amplifier.

DESCRIPTION OF A PREFERRED EMBODIMENT

With reference to the drawings, embodiments of the operational amplifiers according to the present invention will now be explained.

Figure 1:
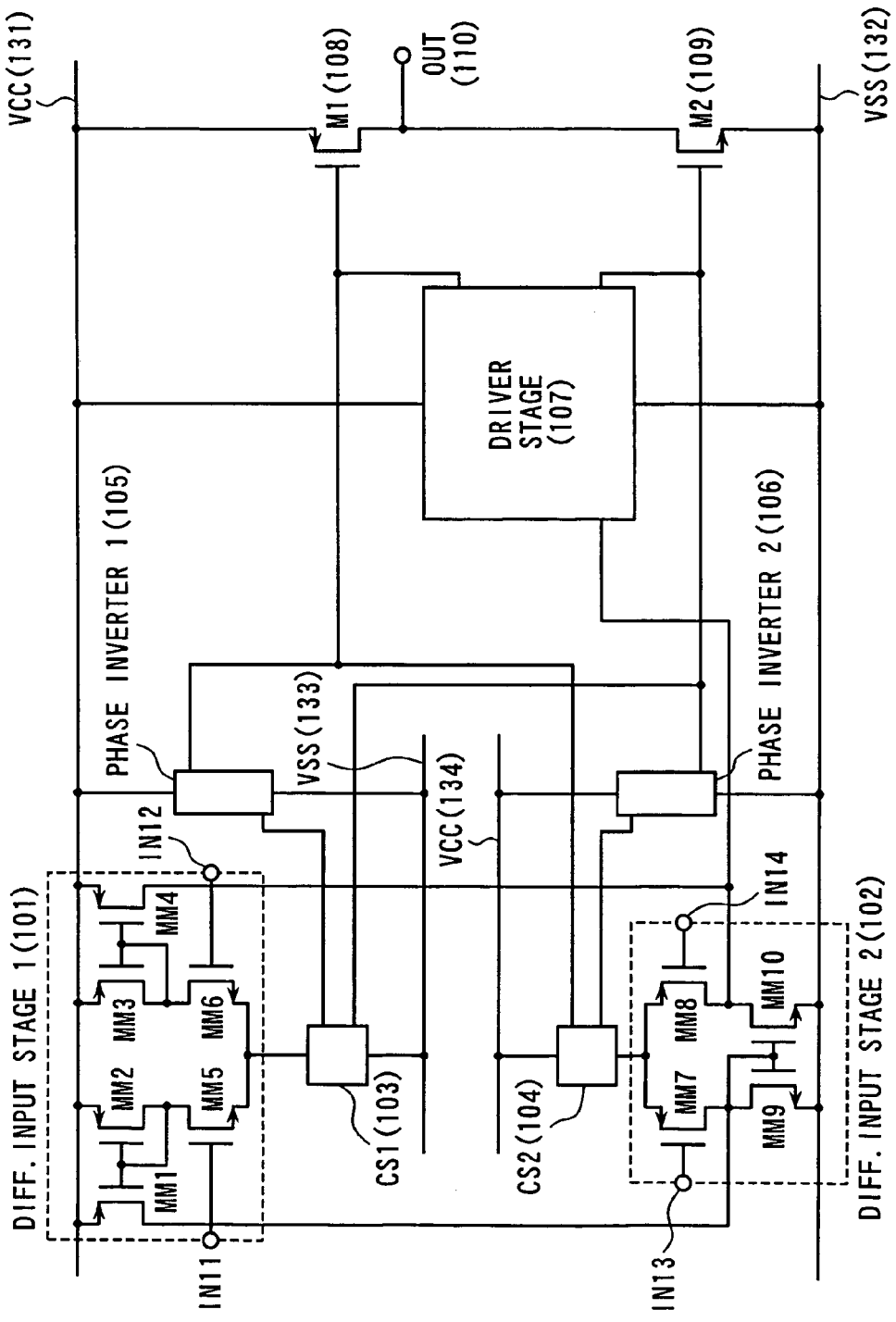
FIG. 1 is a circuit diagram showing a structure of an operational amplifier according to the first embodiment of the present invention.

FIG. 1 is a circuit diagram showing a structure of an operational amplifier according to the first embodiment of the present invention.

With reference to FIG. 1, the operational amplifier according to the first embodiment of the present invention comprises:

a differential input stage 1 (101) which receives differential input signals at a differential input terminal (IN11) and a differential input terminal (IN12), and which is disposed and coupled between a high potential power supply conductor VCC (131) and a low potential power supply conductor VSS (133);

a differential input stage 2 (102) which receives differential input signals at a differential input terminal (IN13) and a differential input terminal (IN14), and which is disposed and coupled between a high potential power supply conductor VCC (134) and a low potential power supply conductor VSS (132);

a current source circuit 1 (CS1) (103) which is disposed and coupled between the differential input stage 1 (101) and the low potential power supply conductor VSS (133), and which is coupled with a phase inverter circuit 1 (105), the gate electrode of an N-channel FET M2 (109) and a phase inverter circuit 2 (106);

a current source circuit 2 (CS2) (104) which is disposed and coupled between the high potential power supply conductor VCC (134) and the differential input stage 2 (102), and which is coupled with a phase inverter circuit 2 (106), the gate electrode of a P-channel FET M1 (108) and a phase inverter circuit 1 (104);

the phase inverter circuit 1 (105) which is disposed and coupled between the high potential power supply conductor VCC (131) and the low potential power supply conductor VSS (133), and which is coupled with the gate electrode of the P-channel FET M1 (108), a driver stage circuit (107), the current source circuit 2 (104) and the current source circuit 1 (103);

the phase inverter circuit 2 (106) which is disposed and coupled between the high potential power supply conductor VCC (134) and the low potential power supply conductor VSS (132), and which is coupled with the gate electrode of the N-channel FET M2 (109), the driver stage circuit (107), the current source circuit 1 (103) and the current source circuit 2 (104); and the driver stage circuit (107) which is disposed and coupled between the high potential power supply conductor VCC (131) and the low potential power supply conductor VSS (132), and which is coupled with the differential input stage 1 (101), the differential input stage 2 (102), the gate electrode of the P-channel FET M1 (108), the phase inverter circuit 1 (105), the current source circuit 2 (104), the gate electrode of the N-channel FET M2 (109), the phase inverter circuit 2 (106) and the current source circuit 1 (103).

The driver stage circuit (107) receives an input signal from the drain electrode of a transistor MM8 of the differential input stage 2 (102), and the drain electrode of the transistor MM8 is also coupled with the drain electrode of a transistor MM10 of the second differential input stage 2 (102) and with the drain electrode of a transistor MM4 of the differential input stage 1 (101). Also, the driver stage circuit (107) outputs a pair of drive signals. One of the pair of drive signals is supplied to the gate electrode of the P-channel FET M1 (108), and is also supplied to an input of the phase inverter circuit 1 (105) and to one input of the current source circuit 2 (104). An output signal of the phase inverter circuit 1 (105) is supplied to one input of the current source circuit 1 (103). The other one of the pair of drive signals is supplied to the gate electrode of the N-channel FET M2 (109), and is also supplied to an input of the phase inverter circuit 2 (106) and to the other input of the current source circuit 1 (103). An output signal of the phase inverter circuit 2 (106) is supplied to the other input of the current source circuit 2 (104).

Further, the operational amplifier according to the first embodiment of the present invention comprises:

the P-channel FET M1 (108) whose drain electrode is coupled with an output terminal (OUT) (110) and the drain electrode of the N-channel FET M2 (109), whose gate electrode is coupled with the driver stage circuit (107), the phase inverter circuit 1 (105) and the current source circuit 2 (104) and whose source electrode is coupled with a power source;

the N-channel FET M2 (109) whose drain electrode is coupled with the output terminal (110) and the drain electrode of the P-channel FET M1 (108), whose gate electrode is coupled with the driver stage circuit (107), the phase inverter circuit 2 (106) and the current source circuit 1 (103) and whose source electrode is coupled with the ground; and the output terminal (110) which is coupled with the drain electrode of the P-channel FET M1 (108) and the drain electrode of the N-channel FET M2 (109), and is also coupled with the differential input stage 1 (101) and the differential input stage 2 (102).

Also, the differential input stage 1 (101) comprises a differential transistor pair of well known art and current mirror circuits of well known art, and the differential input stage 2 (102) comprises a differential transistor pair of well known art and a load circuit of well known art.

That is, the differential input stage 1 (101) comprises: a first differential transistor pair (MM5, MM6) in which one gate electrode is coupled with the differential input terminal (IN11) and the other gate electrode is coupled with the differential input terminal (IN12); a first current mirror circuit (MM1, MM2) which is coupled between the negative side output terminal, i.e., the inverted output terminal, of the first differential transistor pair (MM5, MM6) and the high potential power supply conductor VCC (131); and a second current mirror circuit (MM3, MM4) which is coupled between the positive side output terminal, i.e., the non-inverted output terminal, of the first differential transistor pair (MM5, MM6) and the high potential power supply conductor VCC (131).

Also, the differential input stage 2 (102) comprises: a second differential transistor pair (MM7, MM8) in which one gate electrode is coupled with the differential input terminal (IN13) and the other gate electrode is coupled with the differential input terminal (IN14); and a load circuit (MM9, MM10) which is coupled between the second differential transistor pair (MM7, MM8) and the low potential power supply conductor VSS (132).

Next, an explanation will be made on an operation of the operational amplifier according to the first embodiment of the present invention.

When input signals are inputted to the differential input stage 1 (101) and the differential input stage 2 (102), a signal potential of the output terminal (OUT)(110) of the operational amplifier tends to change according to the input signals. In this case, signal potentials of the gate electrodes of the P-channel FET M1 (108) and N-channel FET M2 (109) rise or fall, and the current source circuit 1 (103) receives the signal potential of the gate electrode of the N-channel FET M2 (109) and a signal potential which is obtained by phase inverting the signal potential of the gate electrode of the P-channel FET M1 (108) by the phase inverter circuit 1 (105).

Also, the current source circuit 2 (104) receives the signal potential of the gate electrode of the P-channel FET M1 (108) and a signal potential which is obtained by phase inverting the signal potential of the gate electrode of the N-channel FET M2 (109) by the phase inverter circuit 2 (106). That is, inputs of the current source circuit 1 (103) and the current source circuit 2 (104) receive signals having different phases. These signals having different phases vary only when input signals vary due to a feedback operation, thereby increasing current values of the differential input stage 1 (101) and the differential input stage 2 (102).

By using the above-mentioned structure, even if either the differential input stage 1 (101) or the differential input stage 2 (102) becomes off, since the signals having opposite phases are inputted to respective current source circuits of the differential input stages, a slew rate increases throughout the full operating range. Also, since the current values are increased only during the change of input signals, increase in overall current value of the operational amplifier becomes very small.

In the operational amplifier mentioned above, usually, the differential input terminal (IN11) and the differential input terminal (IN14) are coupled together to constitute a positive side input terminal, and differential input terminal (IN12) and the differential input terminal (IN13) are coupled together to constitute a negative side input terminal. Also, the output terminal (110) is usually coupled with the negative side input terminal via a feedback circuit not shown in the drawing.

Further, in FIG. 1, the high potential power supply conductor VCC (131) and the high potential power supply conductor VCC (134) are shown as separate conductors. However, in practice, these power supply conductors VCC (131) and VCC (134) are mutually coupled. Also, the low potential power supply conductor VSS (132) and the low potential power supply conductor VSS (133) are shown as separate conductors. However, in practice, these power supply conductors VSS (132) and VSS (133) are mutually coupled.

Figure 2:
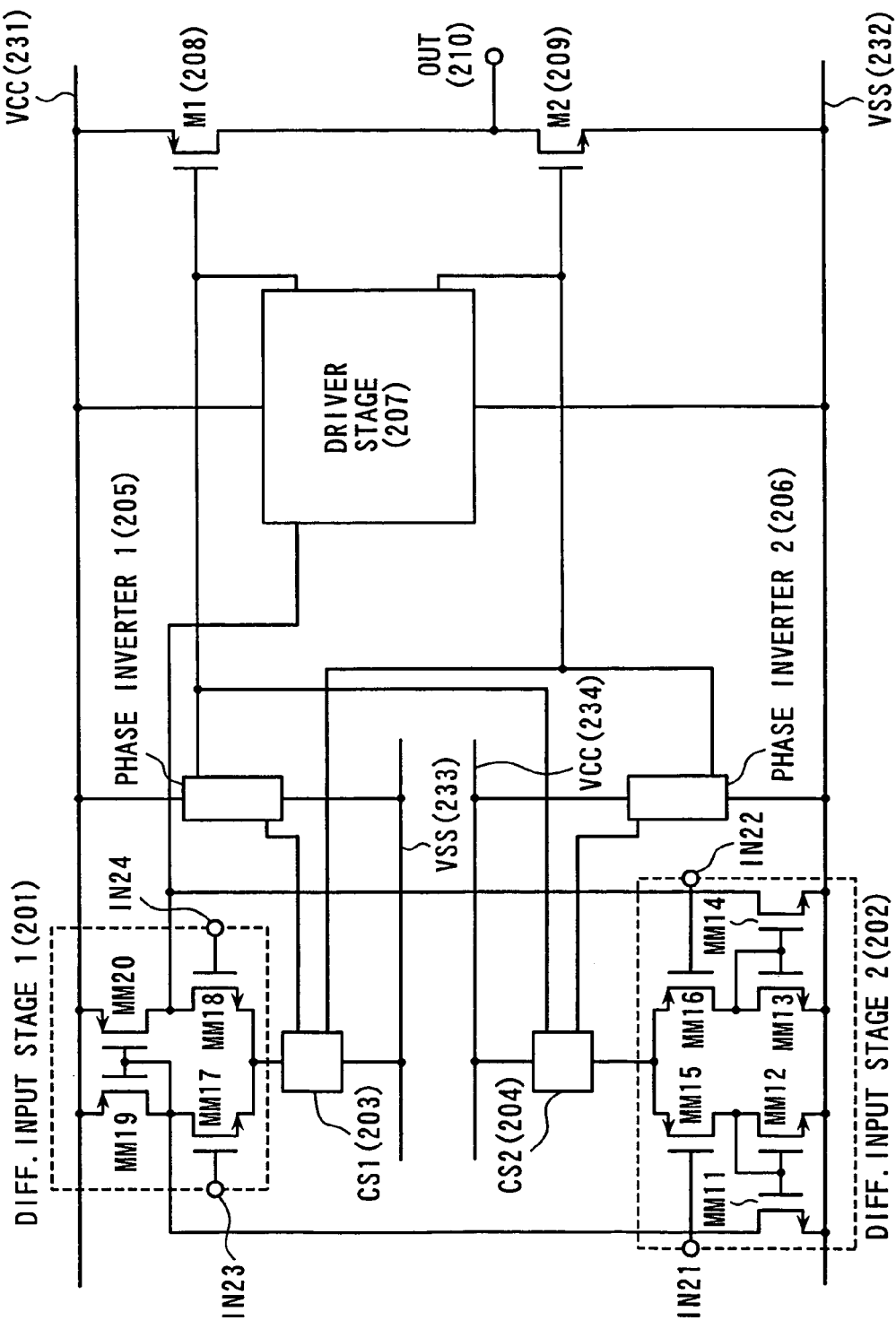
FIG. 2 is a circuit diagram showing a structure of an operational amplifier according to the second embodiment of the present invention.

FIG. 2 is a circuit diagram showing a structure of an operational amplifier according to the second embodiment of the present invention.

The circuit structure of FIG. 2 differs from the circuit of the operational amplifier according to the first embodiment of the present invention (see FIG. 1) in that, in FIG. 2, polarity of the circuit is reversed. That is, the circuit structure of FIG. 2 is modified from the circuit structure of the operational amplifier according to the first embodiment of the present invention in that P-channel FET's are changed to N-channel FET's, and N-channel FET's are changed to P-channel FET's.

Therefore, an operation of the operational amplifier according to the second embodiment of the present invention is substantially the same as that of the operational amplifier according to the first embodiment, except that circuit polarity is reversed. Therefore, an explanation of the operation is omitted here.)

Figure 3:
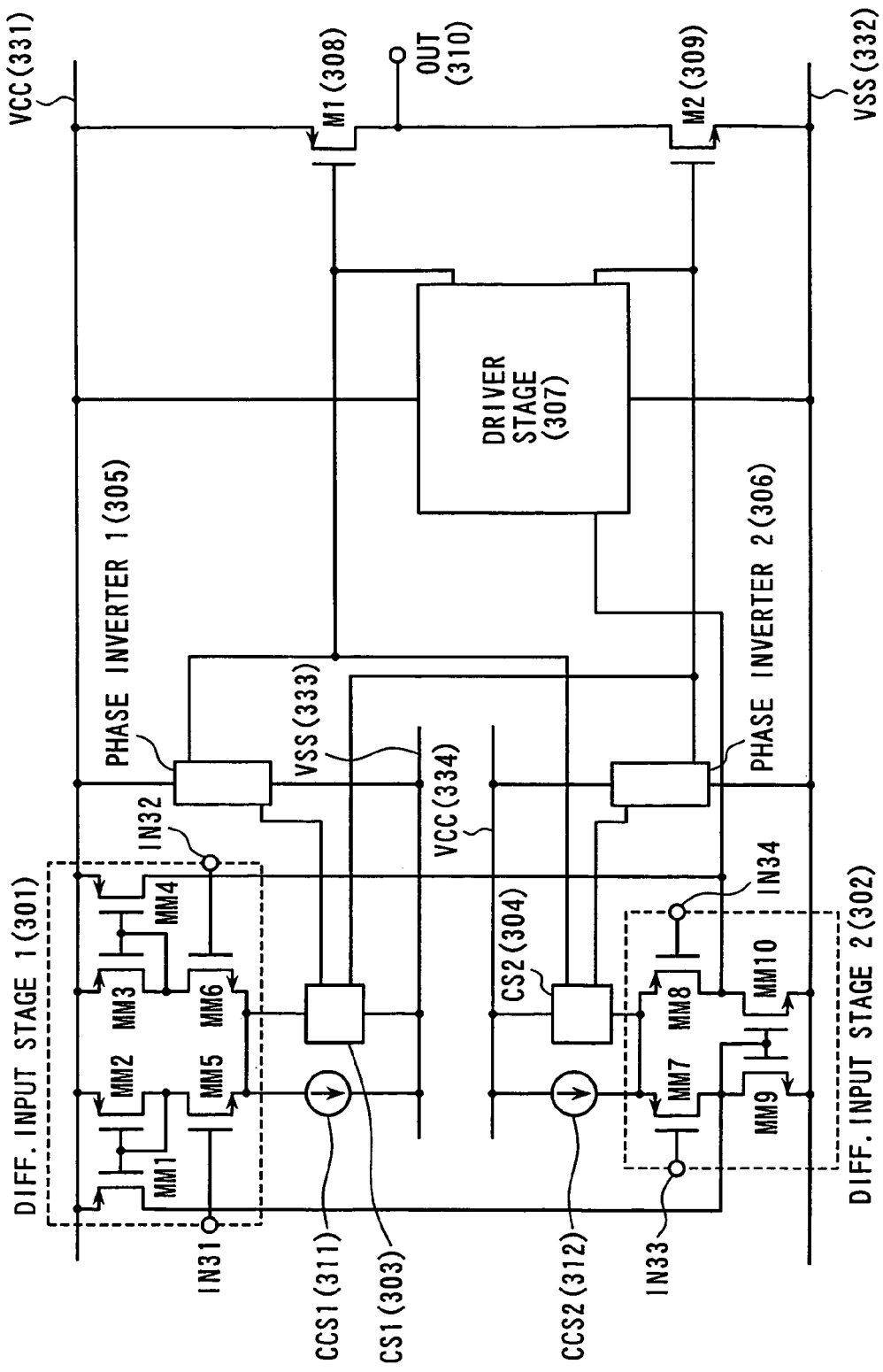
FIG. 3 is a circuit diagram showing a structure of an operational amplifier according to the third embodiment of the present invention.

FIG. 3 is a circuit diagram showing a structure of an operational amplifier according to the third embodiment of the present invention.

The circuit structure of the operational amplifier according to the third embodiment of the present invention is the same as the circuit structure of the operational amplifier according to the first embodiment of the present invention except that, in the circuit structure of the operational amplifier according to the third embodiment of the present invention, a constant current source 1 (CCS1) (311) is coupled parallel with a current source circuit 1 (CS1) (303) and between a differential input stage 1 (301) and the ground, and a constant current source 2 (CCS2) (312) is coupled parallel with a current source circuit 2 (CS2) (304) and between a high potential power supply conductor VCC (334) and a differential input stage 2 (302), respectively.

Therefore, an operation of the operational amplifier according to the third embodiment of the present invention is substantially similar to that of the operational amplifier according to the first embodiment, except that stability of the input stages is improved by adding the constant current source 1 (311) and the constant current source 2 (312) to the current source circuit 1 (303) and the current source circuit 2 (304) which change current values depending on the input signals, respectively. The constant current source 1 (311) and the constant current source 2 (312) supply stable currents through the differential input stage 1 (301) and the differential input stage 2 (302). Therefore, an explanation of the operation is omitted here.

Figure 4:
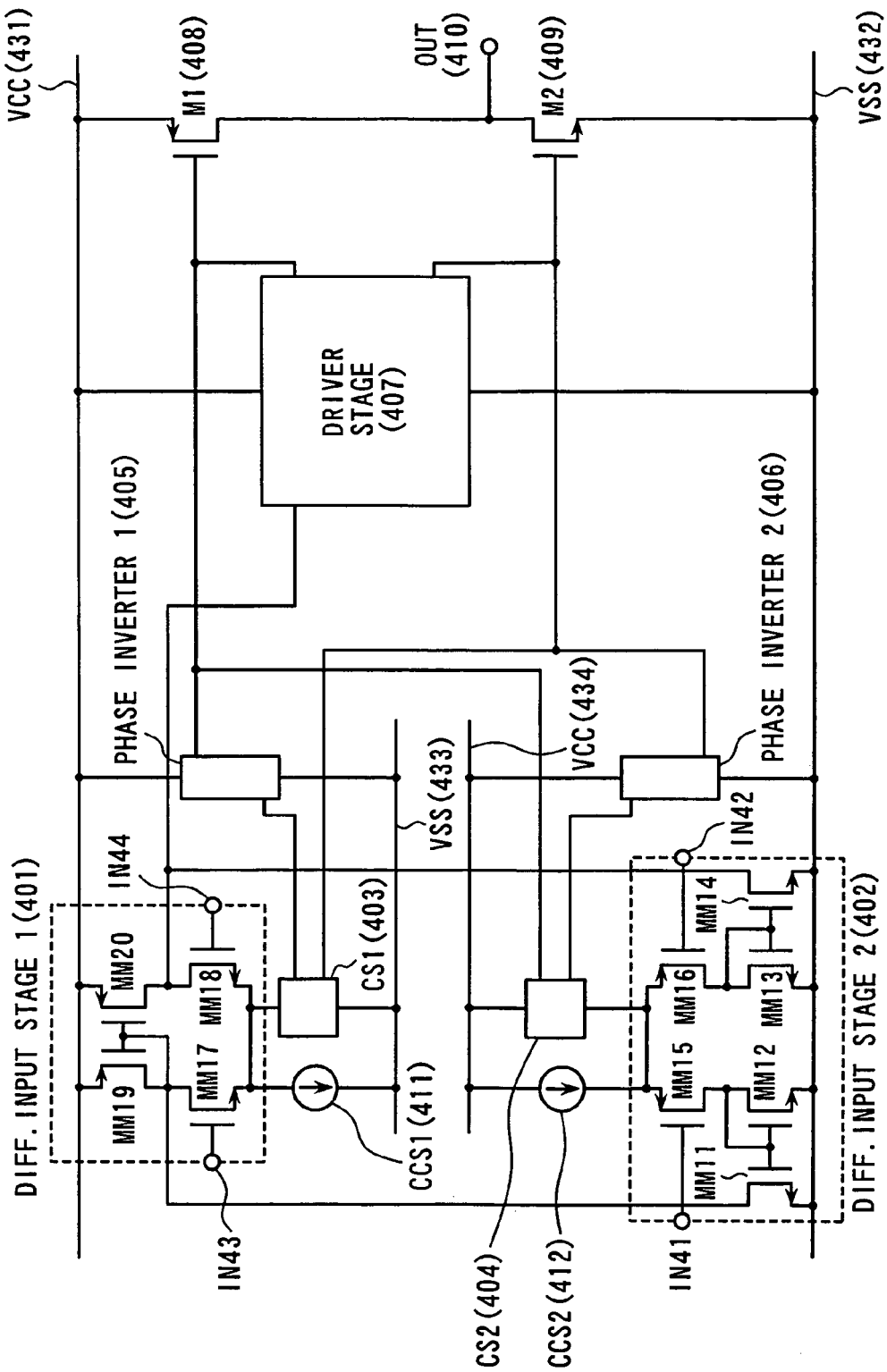
FIG. 4 is a circuit diagram showing a structure of an operational amplifier according to the fourth embodiment of the present invention.

FIG. 4 is a circuit diagram showing a structure of an operational amplifier according to the fourth embodiment of the present invention.

The operational amplifier according to the fourth embodiment of the present invention differs from the circuit of the operational amplifier according to the third embodiment of the present invention in that, in the operational amplifier according to the fourth embodiment, polarity of the circuit is reversed. That is, the circuit structure of FIG. 4 is modified from the circuit structure of FIG. 3 in that P-channel FET's are changed to N-channel FET's, and N-channel FET's are changed to P-channel FET's. Also, in accordance with such changes, polarity of the current source circuit 1 (411) and polarity of the current source circuit 2 (412) are reversed from those of the third embodiment.

Therefore, an operation of the operational amplifier according to the fourth embodiment of the present invention is substantially similar to that of the operational amplifier according to the third embodiment, except that circuit polarity is reversed. Therefore, an explanation of the operation is omitted here.

Figure 5:
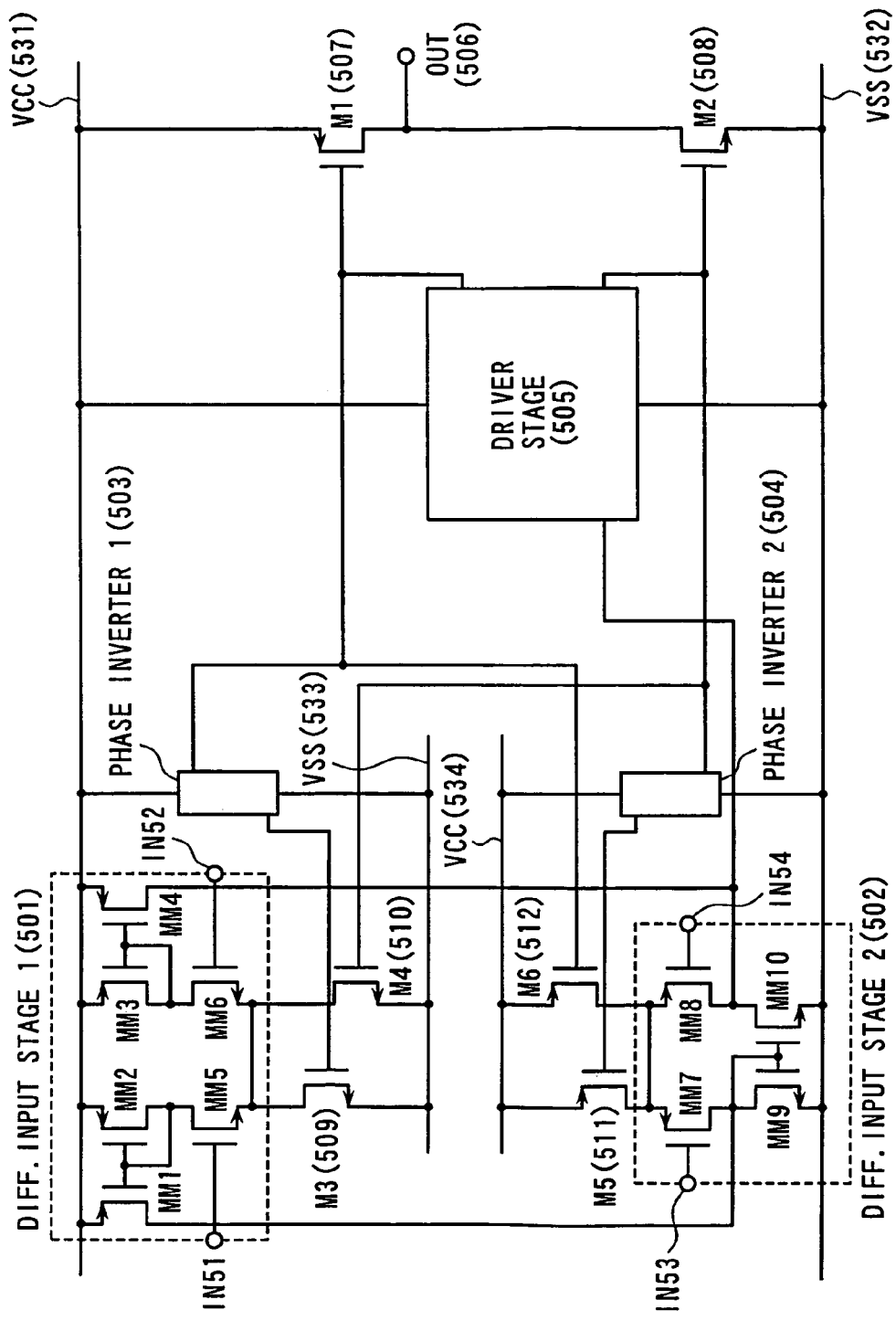
FIG. 5 is a circuit diagram showing a structure of an operational amplifier according to the fifth embodiment of the present invention.

FIG. 5 is a circuit diagram showing a structure of an operational amplifier according to the fifth embodiment of the present invention.

The operational amplifier according to the fifth embodiment of the present invention comprises:

a differential input stage 1 (501) which receives differential input signals at a differential input terminal (IN51) and a differential input terminal (IN52), and which is disposed and coupled between a high potential power supply conductor VCC (531) and a low potential power supply conductor VSS (533);

a differential input stage 2 (502) which receives differential input signals at a differential input terminal (IN53) and a differential input terminal (IN54), and which is disposed and coupled between a high potential power supply conductor VCC (534) and a low potential power supply conductor VSS (532);

a phase inverter circuit 1 (503) which is disposed and coupled between the high potential power supply conductor VCC (531) and the low potential power supply conductor VSS (533), and which is coupled with the gate electrode of the P-channel FET M1 (507), a driver stage circuit (505), the gate electrode of a P-channel FET M6 (512) and the gate electrode of the N-channel FET M3 (509);

a phase inverter circuit 2 (504) which is disposed and coupled between the high potential power supply conductor VCC (534) and the low potential power supply conductor VSS (532), and which is coupled with the gate electrode of the N-channel FET M2 (508), the driver stage circuit (505), the gate electrode of the N-channel FET M4 (510) and the gate electrode of the P-channel FET M5 (511); and the driver stage circuit (505) which is disposed and coupled between the high potential power supply conductor VCC (531) and the low potential power supply conductor VSS (532), and which is coupled with the differential input stage 1 (501), the differential input stage 2 (502), the gate electrode of the P-channel FET M1 (507), the phase inverter circuit 1 (503), the gate electrode of the P-channel FET M6 (512), the gate electrode of the N-channel FET M2 (508), the phase inverter circuit 2 (504) and the gate electrode of the N-channel FET M4 (510).

The operational amplifier according to the fifth embodiment of the present invention further comprises:

the P-channel FET M1 (507) whose drain electrode is coupled with an output terminal (506) and the drain electrode of the N-channel FET M2 (508), whose gate electrode is coupled with the driver stage circuit (505), the phase inverter circuit 1 (503) and the gate electrode of the P-channel FET M6 (512), and whose source electrode is coupled with a power source;

the N-channel FET M2 (508) whose drain electrode is coupled with the output terminal (506) and the drain electrode of the P-channel FET M1 (507), whose gate electrode is coupled with the driver stage circuit (505), the gate electrode of the N-channel FET M4 (510) and the phase inverter circuit 2 (504) and whose source electrode is coupled with the ground;

the N-channel FET M3 (509) whose drain electrode is coupled with the differential input stage 1 (501), whose gate electrode is coupled with the phase inverter circuit 1 (503) and whose source electrode is coupled with the ground;

the N-channel FET M4 (510) whose drain electrode is coupled with the differential input stage 1 (501), whose gate electrode is coupled with the gate electrode of the N-channel FET M2 (508), the driver stage circuit (505) and the phase inverter circuit 2 (504), and whose source electrode is coupled with the ground;

the P-channel FET M5 (511) whose drain electrode is coupled with the differential input stage 2 (502), whose gate electrode is coupled with the phase inverter circuit 2 (504) and whose source electrode is coupled with the power source;

the P-channel FET M6 (512) whose drain electrode is coupled with the differential input stage 2 (502), whose gate electrode is coupled with the gate electrode of the P-channel FET M1 (507), the driver stage circuit (505) and the phase inverter circuit 1 (503), and whose source electrode is coupled with the power source; and the output terminal (506) which is coupled with the drain electrode of the P-channel FET M1 (507) and the drain electrode of the N-channel FET M2 (508), and is also coupled with the differential input stage 1 (501) and the differential input stage 2 (502).

Also, the differential input stage 1 (501) comprises a differential transistor pair of well known art and current mirror circuits of well known art, and the differential input stage 2 (502) comprises a differential transistor pair of well known art and a load circuit of well known art. Therefore, the circuit structures of the differential input stages are the same as those of the operational amplifier according to the first embodiment of the present invention.

Next, an explanation will be made on an operation of the operational amplifier according to the fifth embodiment of the present invention.

When input signals are inputted to the differential input stage 1 (501) and the differential input stage 2 (502), a signal potential of the output terminal (506) of the operational amplifier tends to change according to the input signals.

For example, when the input signals are inputted which raise the signal potential of the output terminal (506), both the signal potential of the gate electrode the P-channel FET M1 (507) and the signal potential of the gate electrode of the N-channel FET M2 (508) fall. In this case, the gate electrode of the N-channel FET M3 (509) receives a signal potential which is obtained by phase inverting the signal potential of the gate electrode of the P-channel FET M1 (507) by the phase inverter circuit 1 (503), that is, the gate electrode of the N-channel FET M3 (509) receives a rising signal potential. The gate electrode of the N-channel FET M4 (510) receives the signal potential of the gate electrode of the N-channel FET M2 (508), that is, the gate electrode of the N-channel FET M4 (510) receives a falling signal potential. Also, the gate electrode of the P-channel FET M5 (511) receives a signal potential which is obtained by phase inverting the signal potential of the gate electrode of the N-channel FET M2 (508) by the phase inverter circuit 2 (504), that is, the gate electrode of the P-channel FET M5 (511) receives a falling signal potential. The gate electrode of the P-channel FET M6 (512) receives the signal potential of the gate electrode of the P-channel FET M1 (507), that is, the gate electrode of the P-channel FET M6 (512) receives a falling signal potential. On the other hand, when the input signals are inputted which lower the signal potential of the output terminal (506), respective gate electrodes receive signals having phases opposite to those of the signals when the input signals are inputted which raise the signal potential of the output terminal (506).

When the above-mentioned structure is used, since the N-channel FET M3 (509) and the N-channel FET M4 (510) are both N-channel FET's and receive signals which have mutually opposite phases, it is possible to make a large current flow through the differential input stage 1 (501) at changing portions of input signals.

Also, since the P-channel FET M5 (511) and the P-channel FET M6 (512) are both P-channel FET's and receive signals which have mutually opposite phases, it is possible to make a large current flow through the differential input stage 2 (502) at changing portions of input signals.

That is, it is possible to make large currents flow through both the differential input stage 1 (501) and the differential input stage 2 (502) at changing portions of input signals. Therefore, even if either the differential input stage 1 (501) or the differential input stage 2 (502) becomes turned off condition depending on the signal potentials of the input signals, it is possible to make a large current flow through a differential input stage as a whole. Thus, it is possible to obtain a high slew rate throughout the full operating range. Also, since the current values are increased only when input signals change, an increase in overall current value of the operational amplifier becomes very small.

Figure 6:
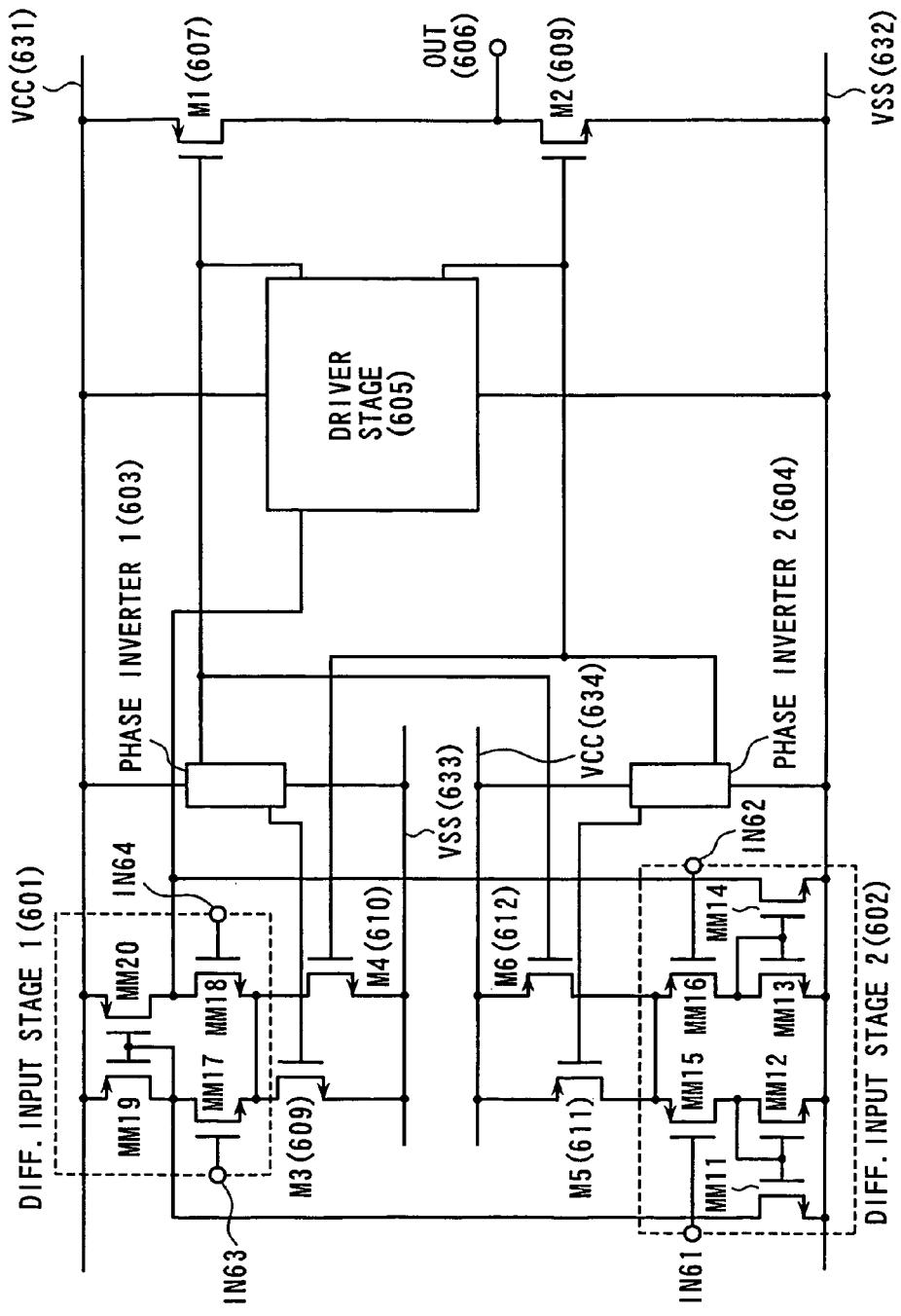
FIG. 6 is a circuit diagram showing a structure of an operational amplifier according to the sixth embodiment of the present invention.

FIG. 6 is a circuit diagram showing a structure of an operational amplifier according to the sixth embodiment of the present invention.

The operational amplifier according to the sixth embodiment of the present invention differs from the circuit of the operational amplifier according to the fifth embodiment of the present invention in that, in the operational amplifier according to the sixth embodiment, polarity of the circuit is reversed. That is, the circuit structure of FIG. 6 is modified from the circuit structure of FIG. 5 in that P-channel FET's are changed to N-channel FET's, and N-channel FET's are changed to P-channel FET's.

Therefore, an operation of the operational amplifier according to the sixth embodiment of the present invention is substantially the same as that of the operational amplifier according to the fifth embodiment, except that circuit polarity is reversed. Therefore, an explanation of the operation is omitted here.

Figure 7:
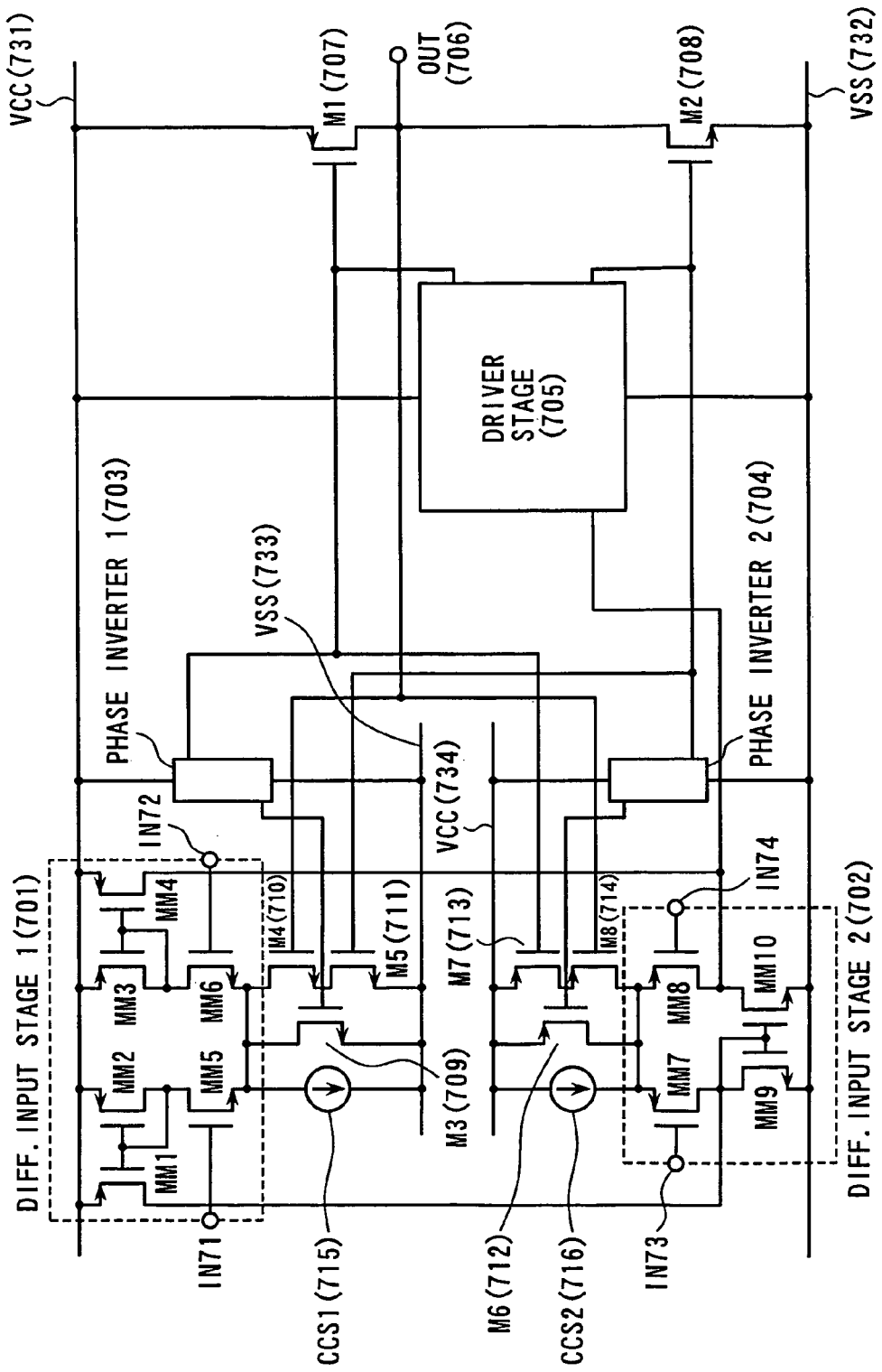
FIG. 7 is a circuit diagram showing a structure of an operational amplifier according to the seventh embodiment of the present invention.

FIG. 7 is a circuit diagram showing a structure of an operational amplifier according to the seventh embodiment of the present invention.

The operational amplifier according to the seventh embodiment of the present invention comprises:

a differential input stage 1 (701) which receives differential input signals, and a differential input stage 2 (702) which receives differential input signals;

a phase inverter circuit 1 (703) which is coupled with the gate electrode of the N-channel FET M3 (709), the gate electrode of a P-channel FET M1 (707), a driver stage circuit (705), and the gate electrode of a P-channel FET M7 (713);

a phase inverter circuit 2 (704) which is coupled with the gate electrode of the P-channel FET M6 (712), the gate electrode of a N-channel FET M2 (708), a driver stage circuit (705), and the gate electrode of a N-channel FET M5 (711); and a driver stage circuit (705) which is coupled with the gate electrode of the P-channel FET M1 (707), the phase inverter circuit 1 (703), the gate electrode of the P-channel FET M7 (713), the gate electrode of the N-channel FET M2 (708), the phase inverter circuit 2 (704), the gate electrode of the N-channel FET M5 (711), the differential input stage 1 (701), and the differential input stage 2 (702).

The operational amplifier according to the seventh embodiment of the present invention further comprises:

the P-channel FET M1 (707) whose drain electrode is coupled with an output terminal (706), the drain electrode of the N-channel FET M2 (708), the gate electrode of the N-channel FET M4 (710) and the gate electrode of the P-channel FET M8 (714), whose gate electrode is coupled with the driver stage circuit (705), the phase inverter circuit 1 (703) and the gate electrode of the P-channel FET M7 (713), and whose source electrode is coupled with a power source;

the N-channel FET M2 (708) whose drain electrode is coupled with the output terminal (706), the drain electrode of the P-channel FET M1 (707) the gate electrode of the N-channel FET M4 (710) and the gate electrode of the P-channel FET M8 (714), whose gate electrode is coupled with the driver stage circuit (705), the phase inverter circuit 2 (704) and the gate electrode of the N-channel FET M5 (711), and whose source electrode is coupled with the ground;

the N-channel FET M3 (709) whose drain electrode is coupled with the differential input stage 1 (701), whose gate electrode is coupled with the phase inverter circuit 1 (703), and whose source electrode is coupled with the ground;

the N-channel FET M4 (710) whose drain electrode is coupled with the differential input stage 1 (701), whose gate electrode is coupled with the output terminal (706), the gate electrode of the P-channel FET M8 (714), the drain electrode of the P-channel FET M1 (707) and the drain electrode of the N-channel FET M2 (708), and whose source electrode is coupled with the drain electrode of the N-channel FET M5 (711);

the N-channel FET M5 (711) whose drain electrode is coupled with the source electrode of the N-channel FET M4 (710), whose gate electrode is coupled with the gate electrode of the N-channel FET M2 (708), the driver stage circuit (705) and the phase inverter circuit 2 (704), and whose source electrode is coupled with the ground;

the P-channel FET M6 (712) whose drain electrode is coupled with the differential input stage 2 (702), whose gate electrode is coupled with the phase inverter circuit 2 (712), and whose source electrode is coupled with a power source;

the P-channel FET M7 (713) whose drain electrode is coupled with the source electrode of the P-channel FET M8 (714), whose gate electrode is coupled with the gate electrode of the P-channel FET M1 (707), the driver stage circuit (705) and the phase inverter circuit 1 (703), and whose source electrode is coupled with a power source;

the P-channel FET M8 (714) whose drain electrode is coupled with the differential input stage 2 (702), whose gate electrode is coupled with the output terminal (706), the gate electrode of the N-channel FET M4 (710), the drain electrode of the P-channel FET M1 (707) and the drain electrode of the N-channel FET M2 (708), and whose source electrode is coupled with the drain electrode of the N-channel FET M7 (713);

a constant current source 1 (715) which is coupled between the differential input stage 1 (701) and the ground;

a constant current source 2 (716) which is coupled between a power source and the differential input stage 2 (702); and the output terminal (706) which is coupled with the drain electrode of the P-channel FET M1 (707), the drain electrode of the N-channel FET M2 (708), the gate electrode of the N-channel FET M4 (710) and the gate electrode of the P-channel FET M8 (714), and which is also coupled with the differential input stage 1 (701) and the differential input stage 2 (702).

Also, the differential input stage 1 (701) comprises a differential transistor pair of well known art and current mirror circuits of well known art, and the differential input stage 2 (702) comprises a differential transistor pair of well known art and a load circuit of well known art. Therefore, the circuit structures of the differential input stages are the same as those of the operational amplifier according to the first embodiment of the present invention.

An operation of the operational amplifier according to the seventh embodiment of the present invention is substantially similar to that of the operational amplifier according to the fifth embodiment, except for an operation concerning the newly added components, that is, the N-channel FET M4 (710), P-channel FET M8 (714), the constant current source 1 (715) and the constant current source 2 (716). Therefore, the operation concerning the newly added components is explained.

In the operational amplifier according to the seventh embodiment of the present invention, the gate electrodes of the N-channel FET M4 (710) and of the N-channel FET M5 (711) receive signals having mutually opposite phases. Therefore, the N-channel FET M4 (710) is provided to prevent a penetrating current from flowing through the differential input stage 1 (701).

Also, the gate electrodes of the P-channel FET M7 (713) and of the P-channel FET M8 (714) receive signals having mutually opposite phases. Therefore, the P-channel FET M8 (714) is provided to prevent a penetrating current from flowing through the differential input stage 2 (702).

The constant current source 1 (715) and the constant current source 2 (716) serve to determine static currents of the differential input stage 1 (701) and the differential input stage 2 (702), respectively.

By using the above-mentioned structure, it is possible to easily determine a current value of a whole circuit of the operational amplifier. It is also possible to obtain a high slew rate throughout a full operating range, without causing the penetrating current flowing through each of the differential input stage 1 (701) and the differential input stage 2 (702).

Figure 8:
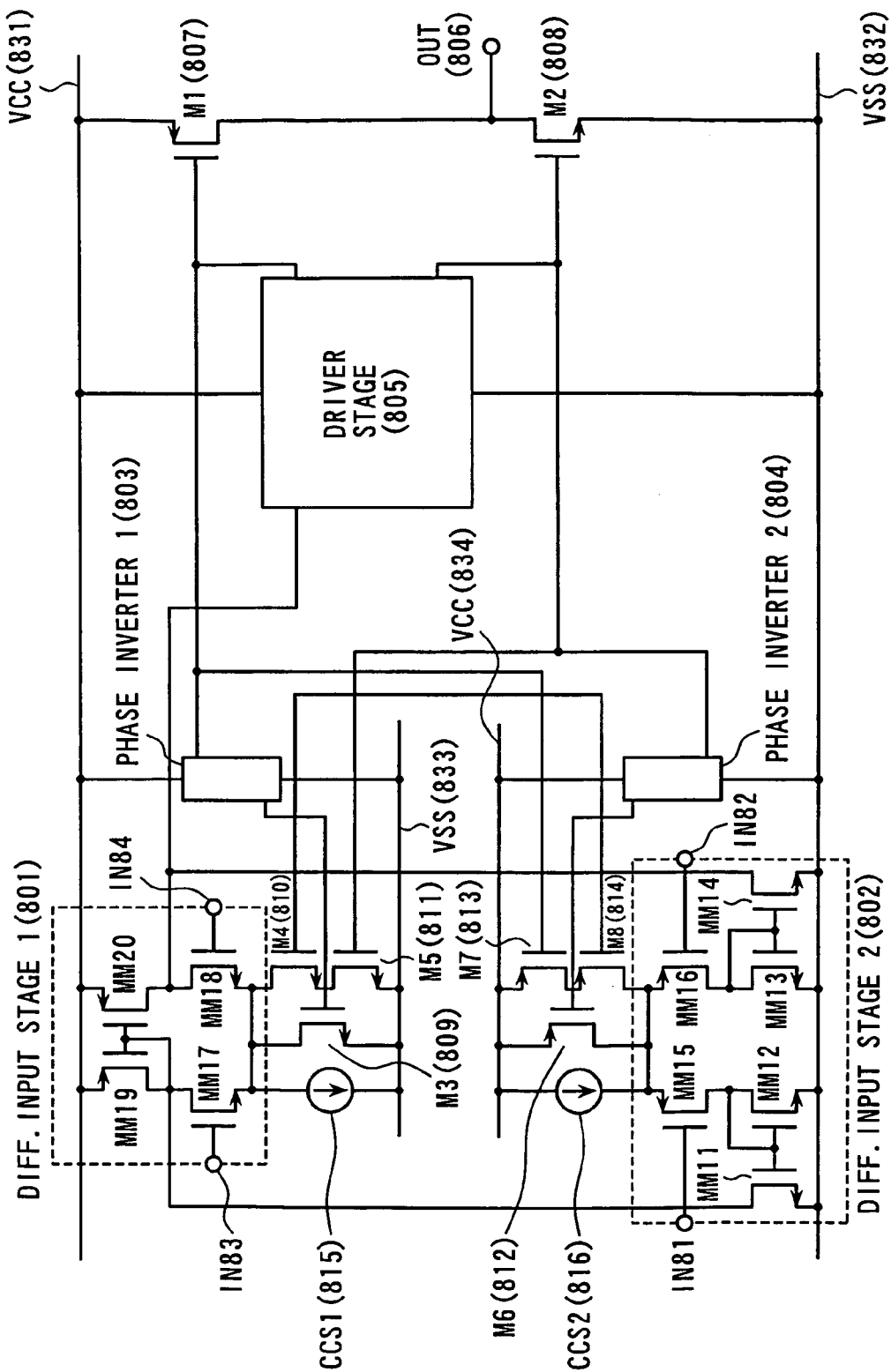
FIG. 8 is a circuit diagram showing a structure of an operational amplifier according to the eighth embodiment of the present invention.

FIG. 8 is a circuit diagram showing a structure of an operational amplifier according to the eighth embodiment of the present invention.

The operational amplifier according to the eighth embodiment of the present invention differs from the circuit of the operational amplifier according to the seventh embodiment of the present invention in that, in the operational amplifier according to the eighth embodiment, polarity of the circuit is reversed from that of the circuit of FIG. 7. That is, the circuit structure of FIG. 8 is modified from the circuit structure of FIG. 7 in that P-channel FET's are changed to N-channel FET's, and N-channel FET's are changed to P-channel FET's. Also, in accordance with such changes, polarity of the constant current source circuit 1 (815) and polarity of the constant current source circuit 2 (816) are reversed from those of the seventh embodiment.

Therefore, an operation of the operational amplifier according to the eighth embodiment of the present invention is substantially similar to that of the operational amplifier according to the seventh embodiment, except that circuit polarity is reversed. Therefore, an explanation of the operation is omitted here.

Figure 9:
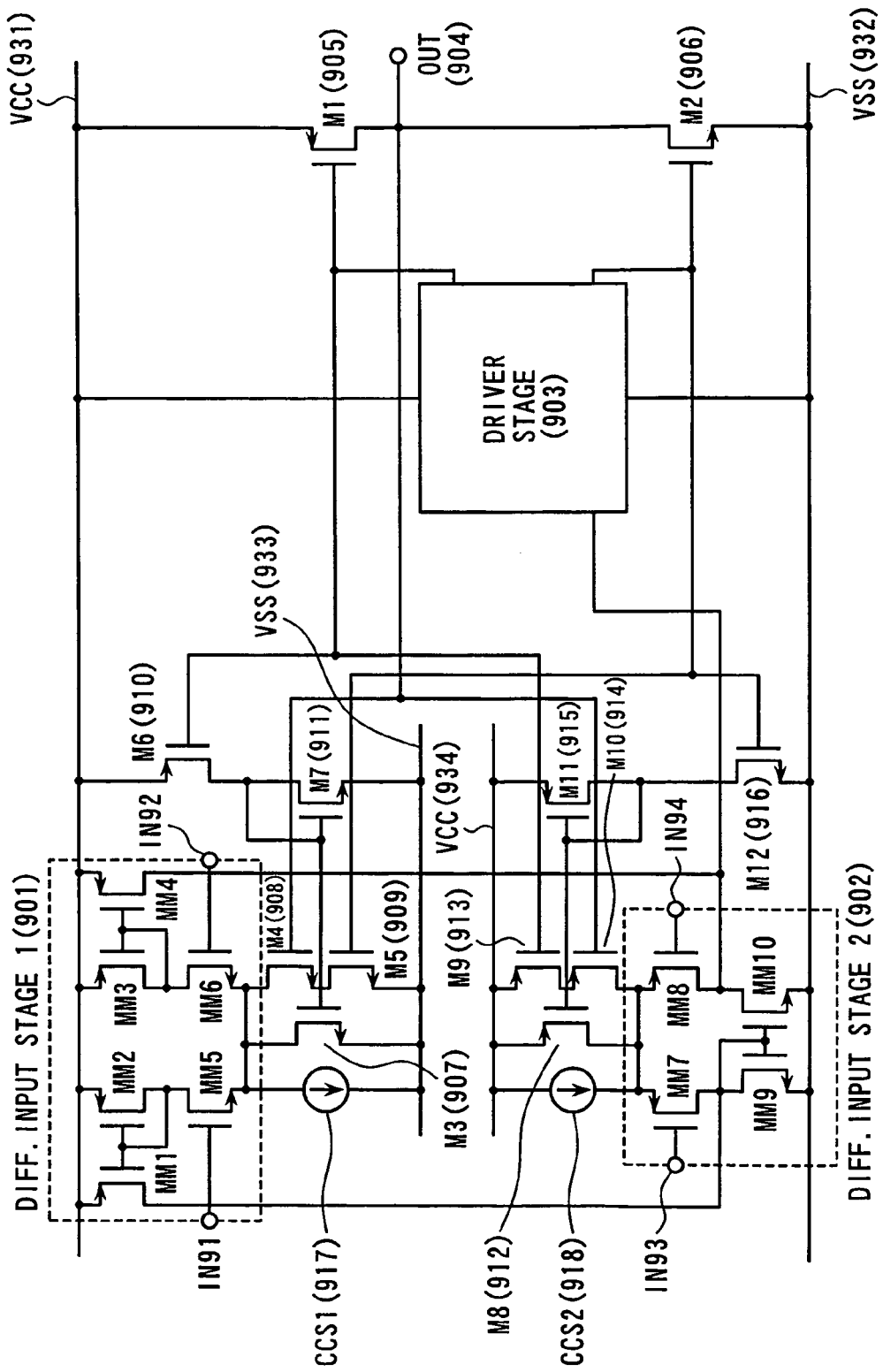
FIG. 9 is a circuit diagram showing a structure of an operational amplifier according to the ninth embodiment of the present invention.

FIG. 9 is a circuit diagram showing a structure of an operational amplifier according to the ninth embodiment of the present invention.

The operational amplifier according to the ninth embodiment of the present invention comprises:

a differential input stage 1 (901) which receives differential input signals, and a differential input stage 2 (902) which receives differential input signals;

a driver stage circuit (903) which is coupled with the gate electrode of the P-channel FET M1 (905), the gate electrode of the P-channel FET M6 (910), the gate electrode of the P-channel FET M9 (913), the gate electrode of the N-channel FET M2 (909), the gate electrode of the N-channel FET M5 (909), the gate electrode of the N-channel FET M12 (916), the differential input stage 1 (901), and the differential input stage 2 (902);

the output terminal (904) which is coupled with the drain electrode of the P-channel FET M1 (905), the drain electrode of the N-channel FET M2 (906), the gate electrode of the N-channel FET M4 (908) and the gate electrode of the P-channel FET M10 (914), and which is also coupled with the differential input stage 1 (901) and the differential input stage 2 (902);

the P-channel FET M1 (905) whose drain electrode is coupled with the output terminal (904), the drain electrode of the N-channel FET M2 (906), the gate electrode of the N-channel FET M4 (908) and the gate electrode of the P-channel FET M10 (914), whose gate electrode is coupled with the driver stage circuit (903), the gate electrode of the P-channel FET M6 (910) and the gate electrode of the P-channel FET M9 (913), and whose source electrode is coupled with a power source; and the N-channel FET M2 (906) whose drain electrode is coupled with the output terminal (904), the drain electrode of the P-channel FET M1 (905), the gate electrode of the N-channel FET M4 (908) and the gate electrode of the P-channel FET M10 (914), whose gate electrode is coupled with the driver stage circuit (903), the gate electrode of the N-channel FET M5 (909) and the gate electrode of the N-channel FET M12 (916), and whose source electrode is coupled with the ground.

The operational amplifier according to the ninth embodiment of the present invention further comprises:

the N-channel FET M3 (907) whose drain electrode is coupled with the differential input stage 1 (901), whose gate electrode is coupled with the gate electrode of a N-channel FET M7 (911), the drain electrode of the N-channel FET M7 (911) and the drain electrode of the P-channel FET M6 (910), and whose source electrode is coupled with the ground;

the N-channel FET M4 (908) whose drain electrode is coupled with the differential input stage 1 (901), whose gate electrode is coupled with the output terminal (904), the gate electrode of the P-channel FET M10 (914), the drain electrode of the P-channel FET M1 (905) and the drain electrode of the N-channel FET M2 (906), and whose source electrode is coupled with the drain electrode of the N-channel FET M5 (909);

the N-channel FET M5 (909) whose drain electrode is coupled with the source electrode of the N-channel FET M4 (908), whose gate electrode is coupled with the gate electrode of the N-channel FET M2 (906), the driver stage circuit (903) and the gate electrode of the N-channel FET M12 (916), and whose source electrode is coupled with the ground;

the P-channel FET M6 (910) whose drain electrode is coupled with the gate electrode of the N-channel FET M7 (911), the drain electrode of the N-channel FET M7 (911) and the gate electrode of the N-channel FET M3 (907), whose gate electrode is coupled with the gate electrode of the P-channel FET M1 (905), the driver stage circuit (903) and the gate electrode of the P-channel FET M9 (913), and whose source electrode is coupled with a power source; and the N-channel FET M7 (911) whose drain electrode and gate electrode are coupled with the drain electrode of the P-channel FET M6 (910) and gate electrode of the N-channel FET M3 (907), and whose source electrode is coupled with the ground.

The operational amplifier according to the ninth embodiment of the present invention still further comprises:

the P-channel FET M8 (912) whose drain electrode is coupled with the differential input stage 2 (902), whose gate electrode is coupled with the gate electrode of a P-channel FET M11 (915), the drain electrode of the P-channel FET M11 (915) and the drain electrode of a N-channel FET M12 (916), and whose source electrode is coupled with a power source;

the P-channel FET M9 (913) whose drain electrode is coupled with the source electrode of the P-channel FET M10 (914), whose gate electrode is coupled with the gate electrode of the P-channel FET M1 (905), the driver stage circuit (903) and the gate electrode of the P-channel FET M6 (910), and whose source electrode is coupled with a power source;

the P-channel FET M10 (914) whose drain electrode is coupled with the differential input stage 2 (902), whose gate electrode is coupled with the output terminal (904), the gate electrode of the N-channel FET M4 (908), the drain electrode of the P-channel FET M1 (905) and the drain electrode of the N-channel FET M2 (906), and whose source electrode is coupled with the drain electrode of the P-channel FET M9 (913);

the P-channel FET M11 (915) whose drain electrode and gate electrode are coupled with the drain electrode of the N-channel FET M12 (916) and gate electrode of the P-channel FET M8 (912), and whose source electrode is coupled with a power source; and the N-channel FET M12 (916) whose drain electrode is coupled with the gate electrode of the P-channel FET M11 (915), the drain electrode of the P-channel FET M11 (915) and the gate electrode of the P-channel FET M8 (912), whose gate electrode is coupled with the gate electrode of the N-channel FET M2 (906), the driver stage circuit (903) and the gate electrode of the N-channel FET M5 (909), and whose source electrode is coupled with the ground.

The operational amplifier according to the ninth embodiment of the present invention further comprises:

a constant current source 1 (917) which is coupled between the differential input stage 1 (901) and the ground; and a constant current source 2 (918) which is coupled between a power source and the differential input stage 2 (902).

Also, the differential input stage 1 (901) comprises a differential transistor pair of well known art and current mirror circuits of well known art, and the differential input stage 2 (902) comprises a differential transistor pair of well known art and a load circuit of well known art. Therefore, the circuit structures of the differential input stages are the same as those of the operational amplifier according to the first embodiment of the present invention.

Next, an explanation will be made on an operation of the operational amplifier according to the ninth embodiment of the present invention.

In the operational amplifier according to the ninth embodiment of the present invention, when input signals are inputted to the differential input stage 1 (901) and the differential input stage 2 (902) so as to raise the signal potential of the output terminal (904), the differential input stage 1 (901) and the differential input stage 2 (902) input a falling signal to the driver stage circuit (903). The signal inputted to the driver stage circuit (903) is propagated to the respective gate electrodes of the P-channel FET M1 (905) and the N-channel FET M2 (906) as level shifted falling signals.

In this case, the gate electrodes of the P-channel FET M6 (910) and of the N-channel FET M12 (916) receive falling signals, and therefore the potentials of the drain and gate electrodes of the N-channel FET M7 (911) and the P-channel FET M11 (915) rise.

With respect to the gate potentials of respective transistors, the potential of the gate electrode of the N-channel FET M3 (907) rises, the potential of the gate electrode of the N-channel FET M4 (908) rises, the potential of the gate electrode of the N-channel FET M5 (909) falls, the potential of the gate electrode of the P-channel FET M8 (912) rises, the potential of the gate electrode of the P-channel FET M9 (913) falls, and the potential of the gate electrode of the P-channel FET M10 (914) rises.

That is, the signals of the gate electrodes of the N-channel FET M3 (907) and the N-channel FET M5 (909) which determine a current value of the differential input stage 1 (901) have mutually opposite phases. Therefore, when the input signals change, a large current always flows through the differential input stage 1 (901). Also, the signals of the gate electrodes of the P-channel FET M8 (912) and the P-channel FET M9 (913) which determine a current value of the differential input stage 2 (902) have mutually opposite phases. Therefore, when the input signals change, a large current always flows through the differential input stage 2 (902).

On the other hand, when input signals are inputted to the differential input stage 1 (901) and the differential input stage 2 (902) so as to fall the signal potential of the output terminal (904), directions of rise and fall of the signal potentials of the respective gate electrodes becomes opposite to those mentioned above. Therefore, detailed explanation thereof is omitted here.

In the above-mentioned structure, since, when the signals change, large currents always flow through both the differential input stage 1 (901) and the differential input stage 2 (902). Therefore, it is possible to obtain a high slew rate throughout the full operating range. Also, since the current values are increased only during the moments in which input signals change, the structure of the present invention is effective in saving power consumption.

Figure 10:
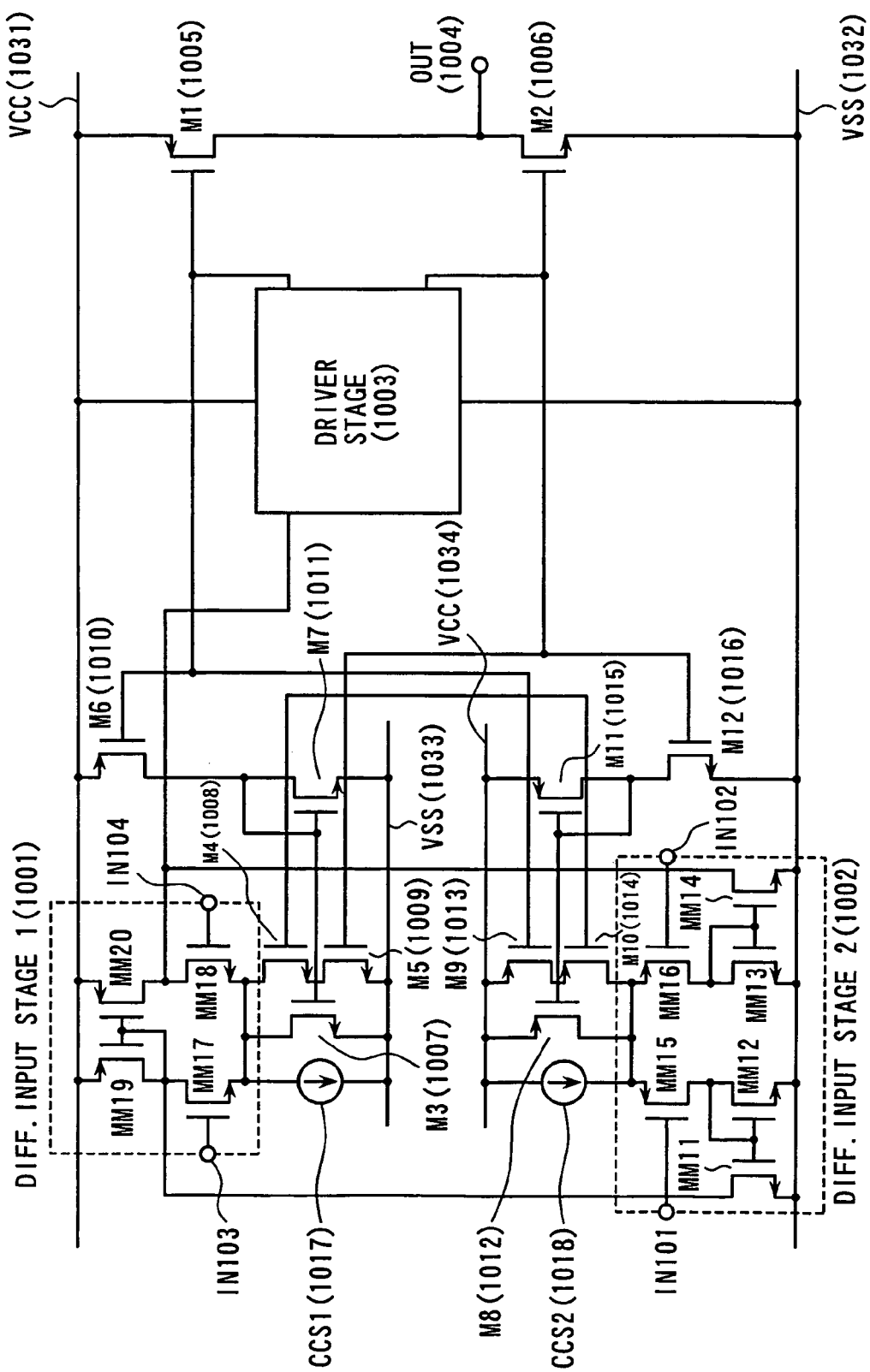
FIG. 10 is a circuit diagram showing a structure of an operational amplifier according to the tenth embodiment of the present invention.

FIG. 10 is a circuit diagram showing a structure of an operational amplifier according to the tenth embodiment of the present invention.

The operational amplifier according to the tenth embodiment of the present invention differs from the circuit of the operational amplifier according to the ninth embodiment of the present invention in that, in the operational amplifier according to the tenth embodiment, polarity of the circuit is reversed from that of the circuit of FIG. 9. That is, the circuit structure of FIG. 10 is modified from the circuit structure of FIG. 9 in that P-channel FET's are changed to N-channel FET's, and N-channel FET's are changed to P-channel FET's. Also, in accordance with such changes, polarity of the constant current source circuit 1 (1017) and polarity of the constant current source circuit 2 (1018) are reversed from those of the ninth embodiment.

Therefore, an operation of the operational amplifier according to the tenth embodiment of the present invention is substantially similar to that of the operational amplifier according to the ninth embodiment, except that circuit polarities are reversed. Therefore, an explanation of the operation thereof is omitted here.

Figure 11:
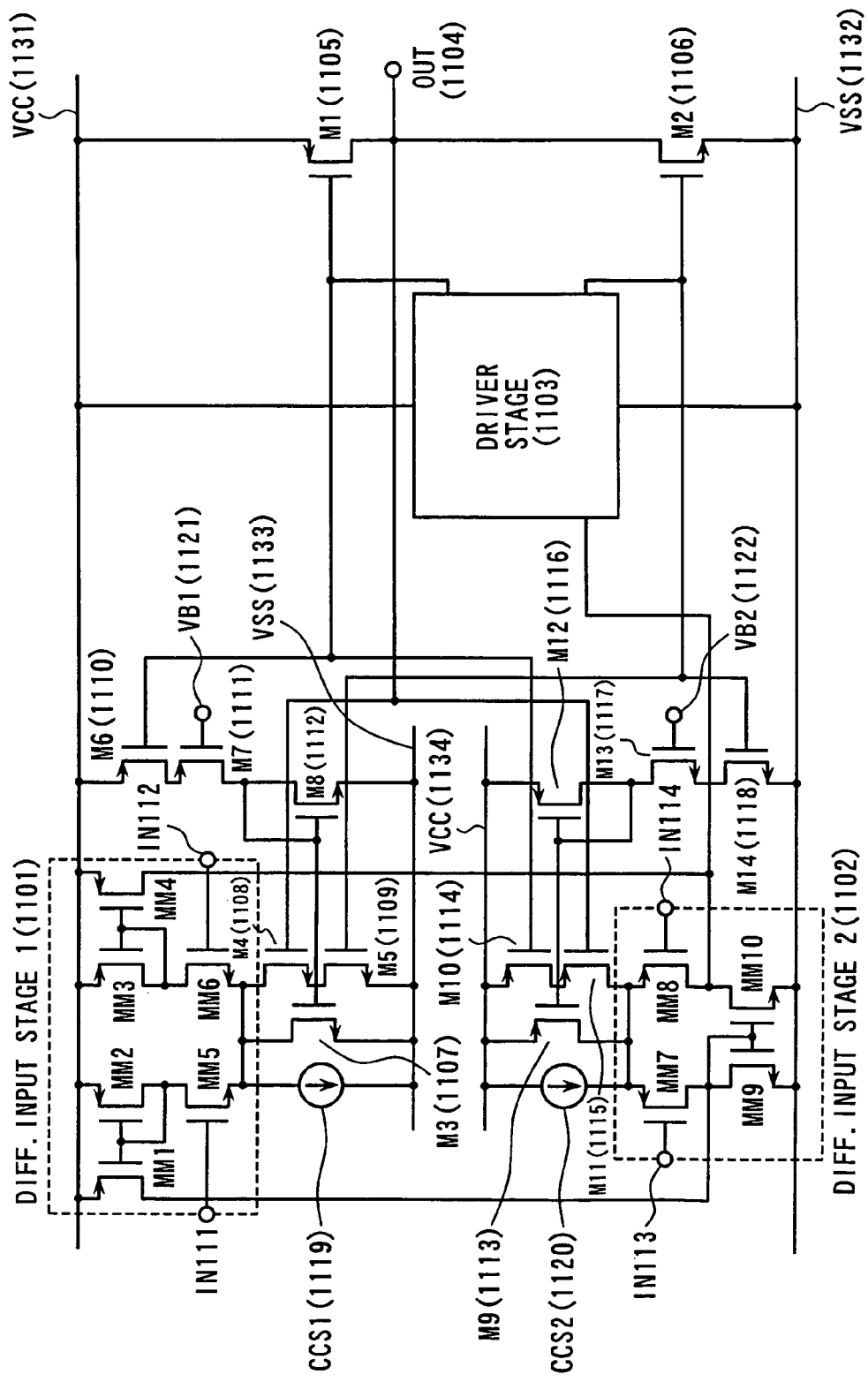
FIG. 11 is a circuit diagram showing a structure of an operational amplifier according to the eleventh embodiment of the present invention.

FIG. 11 is a circuit diagram showing a structure of an operational amplifier according to the eleventh embodiment of the present invention.

The operational amplifier according to the eleventh embodiment of the present invention comprises:

a differential input stage 1 (1101) which receives differential input signals, and a differential input stage 2 (1102) which receives differential input signals;

a driver stage circuit (1103) which is coupled with the gate electrode of the P-channel FET M1 (1105), the gate electrode of the P-channel FET M6 (1110), the gate electrode of the P-channel FET M10 (1114), the gate electrode of the N-channel FET M2 (1106), the gate electrode of the N-channel FET M114 (1118), the gate electrode of the N-channel FET M5 (1109), the differential input stage 1 (1101), and the differential input stage 2 (1102);

the output terminal (1104) which is coupled with the drain electrode of the P-channel FET M1 (1105), the drain electrode of the N-channel FET M2 (1106), the gate electrode of the N-channel FET M4 (1108) and the gate electrode of the P-channel FET M11 (1115), and which is also coupled with the differential input stage 1 (1101) and the differential input stage 2 (1102);

the P-channel FET M1 (1105) whose drain electrode is coupled with the output terminal (1104), the drain electrode of the N-channel FET M2 (1106), the gate electrode of the N-channel FET M4 (1108) and the gate electrode of the P-channel FET M11 (1115), whose gate electrode is coupled with the driver stage circuit (1103), the gate electrode of the P-channel FET M6 (1110) and the gate electrode of the P-channel FET M10 (1114), and whose source electrode is coupled with a power source; and the N-channel FET M2 (1106) whose drain electrode is coupled with the output terminal (1104), the drain electrode of the P-channel FET M1 (1105), the gate electrode of the N-channel FET M4 (1108) and the gate electrode of the P-channel FET M11 (1115), whose gate electrode is coupled with the driver stage circuit (1103), the gate electrode of the N-channel FET M5 (1109) and the gate electrode of the N-channel FET M14 (1118), and whose source electrode is coupled with the ground.

The operational amplifier according to the eleventh embodiment of the present invention further comprises:

the N-channel FET M3 (1107) whose drain electrode is coupled with the differential input stage 1 (1101), whose gate electrode is coupled with the gate electrode of a N-channel FET M8 (1112), the drain electrode of the N-channel FET M8 (1112) and the drain electrode of the P-channel FET M7 (1111), and whose source electrode is coupled with the ground;

the N-channel FET M4 (1108) whose drain electrode is coupled with the differential input stage 1 (1101), whose gate electrode is coupled with the output terminal (1104), the gate electrode of the P-channel FET M11 (1115), the drain electrode of the P-channel FET M1 (1105) and the drain electrode of the N-channel FET M2 (1106), and whose source electrode is coupled with the drain electrode of the N-channel FET M5 (1109);

the N-channel FET M5 (1109) whose drain electrode is coupled with the source electrode of the N-channel FET M4 (1108), whose gate electrode is coupled with the gate electrode of the N-channel FET M2 (1106), the driver stage circuit (1103) and the gate electrode of the N-channel FET M14 (1118), and whose source electrode is coupled with the ground;

the P-channel FET M6 (1110) whose drain electrode is coupled with the source electrode of the P-channel FET M7 (1111), whose gate electrode is coupled with the gate electrode of the P-channel FET M1 (1105), the driver stage circuit (1103) and the gate electrode of the P-channel FET M10 (1114), and whose source electrode is coupled with a power source;

P-channel FET M7 (1111) whose drain electrode is coupled with the gate electrode of the N-channel FET M8 (1112), the drain electrode of the N-channel FET M8 (1112) and the gate electrode of the N-channel FET M3 (1107), whose gate electrode is coupled with a predetermined voltage VB1 (1121), and whose source electrode is coupled with the drain electrode of the P-channel FET M6 (1110); and the N-channel FET M8 (1112) whose drain electrode and gate electrode are coupled with the drain electrode of the P-channel FET M7 (1111) and with the gate electrode of the N-channel FET M3 (1107), and whose source electrode is coupled with the ground.

The operational amplifier according to the eleventh embodiment of the present invention still further comprises:

the N-channel FET M9 (1113) whose drain electrode is coupled with the differential input stage 2 (1102), whose gate electrode is coupled with the gate electrode of a P-channel FET M12 (1116), the drain electrode of the P-channel FET M12 (1116) and the drain electrode of a N-channel FET M13 (1117), and whose source electrode is coupled with a power source;

the N-channel FET M10 (1114) whose drain electrode is coupled with the source electrode of the N-channel FET M11 (1115), whose gate electrode is coupled with the gate electrode of the P-channel FET M1 (1105), the driver stage circuit (1103) and the gate electrode of the P-channel FET M6 (1110), and whose source electrode is coupled with a power source;

the N-channel FET M11 (1115) whose drain electrode is coupled with the differential input stage 2 (1102), whose gate electrode is coupled with the output terminal (1104), the gate electrode of the N-channel FET M4 (1108), the drain electrode of the P-channel FET M1 (1105) and the drain electrode of the N-channel FET M2 (1106), and whose source electrode is coupled with the drain electrode of the P-channel FET M10 (1114);

the P-channel FET M12 (1116) whose drain electrode and gate electrode are coupled with gate electrode of the P-channel FET M9 (1113) and with the drain electrode of the N-channel FET M13 (1117), and whose source electrode is coupled with a power source;

the N-channel FET M13 (1117) whose drain electrode is coupled with the drain electrode of the P-channel FET M12 (1116), the gate electrode of the P-channel FET M12 (1116) and the gate electrode of the P-channel FET M9 (1113), and whose gate electrode is coupled with a predetermined voltage VB2 (1122), and whose source electrode is coupled with the drain electrode of the N-channel FET M14 (1118); and the N-channel FET M14 (1118) whose drain electrode is coupled with the source electrode of the N-channel FET M13 (1117), whose gate electrode is coupled with the gate electrode of the N-channel FET M2 (1106), the driver stage circuit (1103) and the gate electrode of the N-channel FET M5 (1109), and whose source electrode is coupled with the ground.

The operational amplifier according to the eleventh embodiment of the present invention further comprises:

a constant current source 1 (1119) which is coupled between the differential input stage 1 (1101) and the ground; and a constant current source 2 (1120) which is coupled between a power source and the differential input stage 2 (1102).

Also, the differential input stage 1 (1101) comprises a differential transistor pair of well known art and current mirror circuits of well known art, and the differential input stage 2 (1102) comprises a differential transistor pair of well known art and a load circuit of well known art. Therefore, the circuit structures of the differential input stages are the same as those of the operational amplifier according to the first embodiment of the present invention.

Next, an explanation will be made on an operation of the operational amplifier according to the eleventh embodiment of the present invention. The basic operation of the operational amplifier according to the eleventh embodiment of the present invention is substantially the same as that of the operational amplifier according to the ninth embodiment of the present invention, and an explanation will be made on an operation concerning the newly added P-channel FET M7 (1111) and the N-channel FET M13 (1117).

With respect to the P-channel FET M7 (1111) of the operational amplifier according to the eleventh embodiment of the present invention, when a falling signal is inputted to the gate of the P-channel FET M6 (1110), a penetrating current may flow through the P-channel FET M6 (1110). In this case, by coupling the gate electrode of the P-channel FET M7 (1111) to the predetermined voltage VB1 (1121), it is possible to suppress such penetrating current. The predetermined voltage VB1 (1121) may be a DC voltage having a constant potential.

On the other hand, when a rising signal is inputted to the gate of the N-channel FET M14 (1118), a penetrating current may flow through the N-channel FET M14 (1118). In this case, by coupling the gate electrode of the N-channel FET M13 (1117) to the predetermined voltage VB2 (1122), it is possible to suppress such penetrating current. The predetermined voltage VB2 (1122) may be a DC voltage having a constant potential.

By using the above-mentioned structure, it is possible to prevent a penetrating current from flowing through each of the differential input stage 1 (1101) and the differential input stage 2 (1102).

Figure 12:
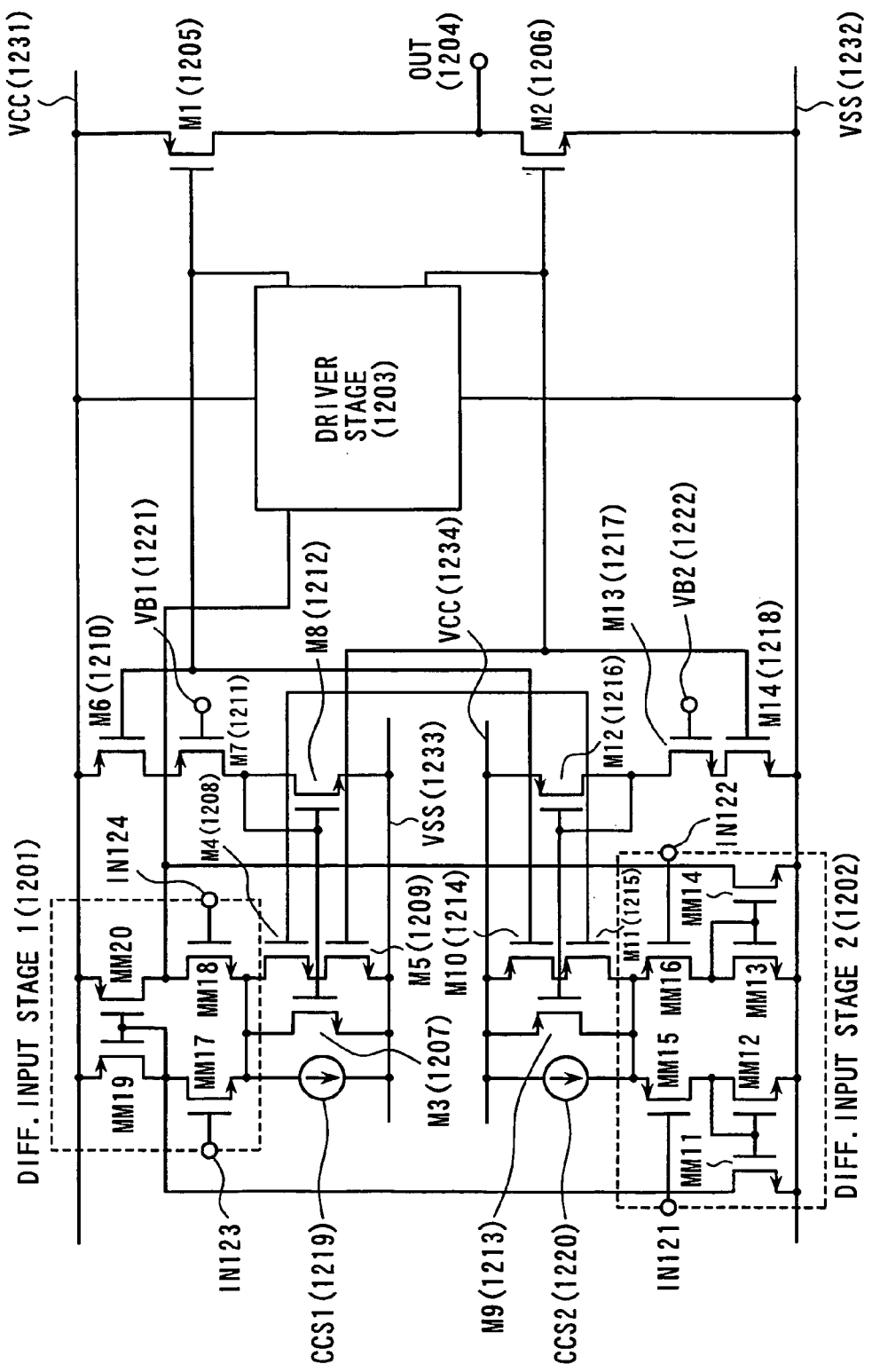
FIG. 12 is a circuit diagram showing a structure of an operational amplifier according to the twelfth embodiment of the present invention.

FIG. 12 is a circuit diagram showing a structure of an operational amplifier according to the twelfth embodiment of the present invention.

The operational amplifier according to the twelfth embodiment of the present invention differs from the circuit of the operational amplifier according to the eleventh embodiment of the present invention in that, in the operational amplifier according to the twelfth embodiment, polarity of the circuit is reversed from that of the operational amplifier according to the eleventh embodiment of the present invention. That is, the circuit structure of FIG. 12 is modified from the circuit structure of FIG. 11 in that P-channel FET's are changed to N-channel FET's, and N-channel FET's are- changed to P-channel FET's. Also, in accordance with such changes, polarity of the constant current source circuit 1 (1219) and polarity of the constant current source circuit 2 (1220) are reversed from those of the eleventh embodiment.

Therefore, an operation of the operational amplifier according to the twelfth embodiment of the present invention is substantially similar to that of the operational amplifier according to the eleventh embodiment, except that circuit polarities are reversed. Therefore, an explanation of the operation thereof is omitted here.

Figure 13:
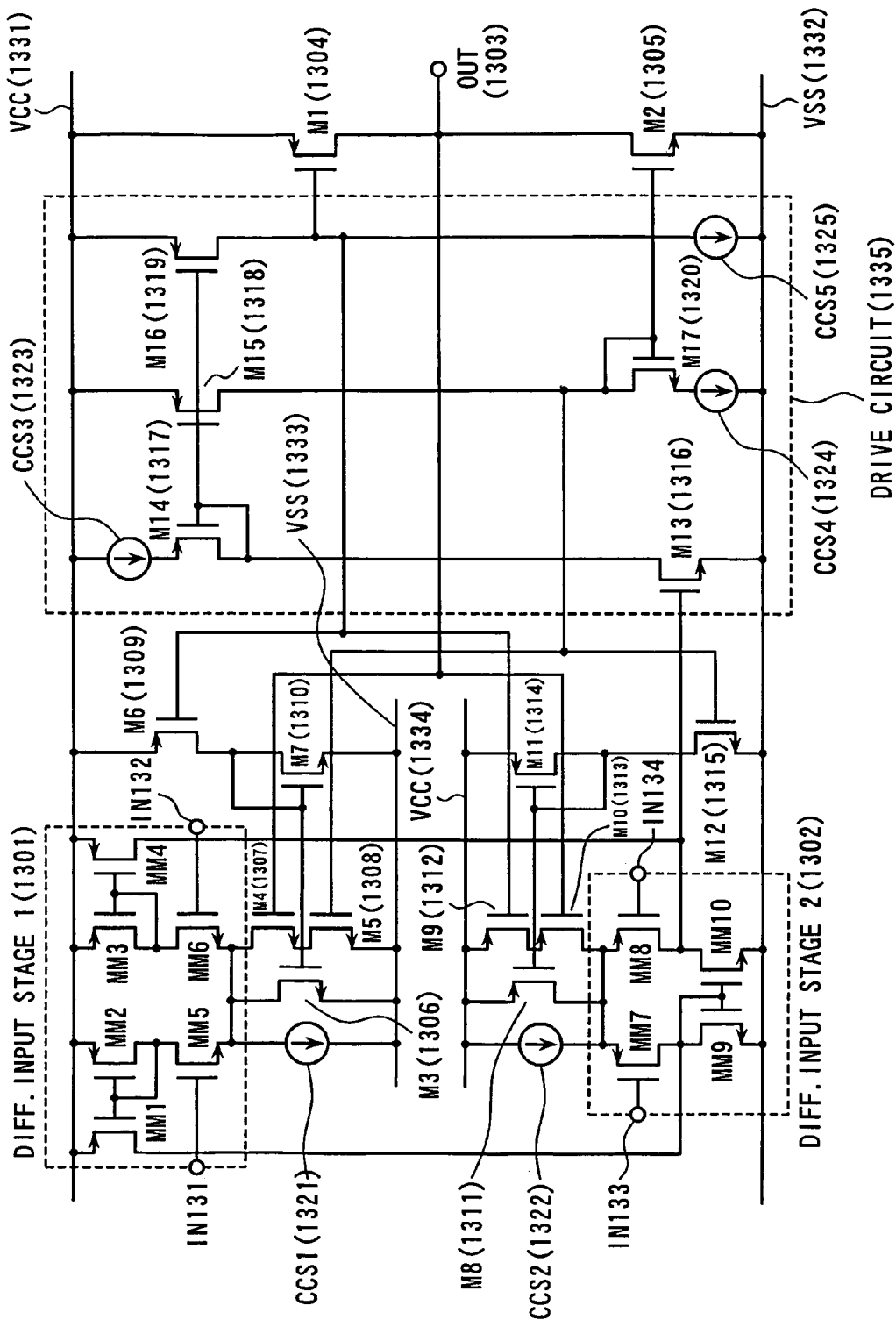
FIG. 13 is a circuit diagram showing a structure of an operational amplifier according to the thirteenth embodiment of the present invention.

FIG. 13 is a circuit diagram showing a structure of an operational amplifier according to the thirteenth embodiment of the present invention.

The operational amplifier according to the thirteenth embodiment of the present invention comprises:

a differential input stage 1 (1301) which receives differential input signals, and a differential input stage 2 (1302) which receives differential input signals;

an output terminal (1303) which is coupled with the drain electrode of a P-channel FET M1 (1304), the drain electrode of an N-channel FET M2 (1305), the gate electrode of an N-channel FET M4 (1307) and the gate electrode of a P-channel FET M10 (1313), and which is also coupled with a differential input stage 1 (1302) and a differential input stage 2 (1303);

the P-channel FET M1 (1304) whose drain electrode is coupled with the output terminal (1303), the drain electrode of the N-channel FET M2 (1305), the gate electrode of the N-channel FET M4 (1307) and the gate electrode of the P-channel FET M10 (1313), whose gate electrode is coupled with the a P-channel FET M16 (1319), the gate electrode of the P-channel FET M6 (1309) and the gate electrode of the P-channel FET M9 (1312) and a constant current source 5 (1325), and whose source electrode is coupled with a power source; and the N-channel FET M2 (1305) whose drain electrode is coupled with the output terminal (1303), the drain electrode of the P-channel FET M1 (1304), the gate electrode of the N-channel FET M4 (1307) and the gate electrode of the P-channel FET M10 (1313), whose gate electrode is coupled with the gate electrode of an N-channel FET M17 (1320), the drain electrode of the N-channel FET M17 (1320), the drain electrode of a P-channel FET M15 (909) and the gate electrode of the N-channel FET M5 (1308) and the gate electrode of an N-channel FET M12 (1315), and whose source electrode is coupled with the ground.

The operational amplifier according to the thirteenth embodiment of the present invention further comprises:

the N-channel FET M3 (1306) whose drain electrode is coupled with the differential input stage 1 (1301), whose gate electrode is coupled with the gate electrode of a N-channel FET M7 (1310), the drain electrode of the N-channel FET M7 (1310) and the drain electrode of the P-channel FET M6 (1309), and whose source electrode is coupled with the ground;

the N-channel FET M4 (1307) whose drain electrode is coupled with the differential input stage 1 (1301), whose gate electrode is coupled with the output terminal (1203), the gate electrode of the P-channel FET M10 (1313), the drain electrode of the P-channel FET M1 (1304) and the drain electrode of the N-channel FET M2 (1305), and whose source electrode is coupled with the drain electrode of the N-channel FET M5 (1308);

the N-channel FET M5 (1308) whose drain electrode is coupled with the source electrode of the N-channel FET M4 (1307), whose gate electrode is coupled with the gate electrode of the N-channel FET M2 (1305), the gate electrode of an N-channel FET M17 (1320), the drain electrode of the N-channel FET M17 (1320), the drain electrode of a P-channel FET M15 (1318) and the gate electrode of the N-channel FET M12 (1315), and whose source electrode is coupled with the ground;

the P-channel FET M6 (1309) whose drain electrode is coupled with the drain electrode of the N-channel FET M7 (1310), the gate electrode of the N-channel FET M7 (1310) and the gate electrode of the N-channel FET M3 (1306), whose gate electrode is coupled with the gate electrode of the P-channel FET M1 (1304), a constant current source 5 (1325), the drain electrode of a P-channel FET M16 (1319) and the gate electrode of the P-channel FET M9 (1312), and whose source electrode is coupled with a power source; and the N-channel FET M7 (1310) whose drain electrode and gate electrode are coupled with the drain electrode of the P-channel FET M6 (1309) and gate electrode of the N-channel FET M3 (1306), and whose source electrode is coupled with the ground.

The operational amplifier according to the thirteenth embodiment of the present invention still further comprises:

the P-channel FET M8 (1311) whose drain electrode is coupled with the differential input stage 2 (1302), whose gate electrode is coupled with the drain electrode of a P-channel FET M1 (1314), the gate electrode of the P-channel FET M1 (1314) and the drain electrode of the N-channel FET M12 (1315), and whose source electrode is coupled with a power source;

the P-channel FET M9 (1312) whose drain electrode is coupled with the source electrode of the P-channel FET M10 (1313), whose gate electrode is coupled with the gate electrode of the P-channel FET M1 (1304), the constant current source 5 (1325), the drain electrode of the P-channel FET M16 (1319) and the gate electrode of the P-channel FET M6 (1309), and whose source electrode is coupled with a power source;

the P-channel FET M10 (1313) whose drain electrode is coupled with the differential input stage 2 (1302), whose gate electrode is coupled with the output terminal (1303), the gate electrode of the N-channel FET M4 (1307), the drain electrode of the P-channel FET M1 (1304) and the drain electrode of the N-channel FET M2 (1305), and whose source electrode is coupled with the drain electrode of the P-channel FET M9 (1312);

the P-channel FET M1 (1314) whose drain electrode and gate electrode are coupled with the gate electrode of the P-channel FET M8 (1311) and the drain electrode of the N-channel FET M12 (1315), and whose source electrode is coupled with a power source;

the N-channel FET M12 (1315) whose drain electrode is coupled with the drain electrode of the P-channel FET M11 (1314), the gate electrode of the P-channel FET M1 (1314) and the gate electrode of the P-channel FET M8 (1311), whose gate electrode is coupled with the gate electrode of the N-channel FET M5 (1308), the drain electrode of the P-channel FET M15 (1318), the drain electrode of the N-channel FET M17 (1320), the gate electrode of the N-channel FET M17 (1320) and the gate electrode of the N-channel FET M2 (1305), and whose source electrode is coupled with the ground.

The operational amplifier according to the thirteenth embodiment of the present invention has a driver circuit (1335) comprising:

an N-channel FET M13 (1316) whose drain electrode is coupled with the drain electrode of the P-channel FET M14 (1317), the gate electrode of the P-channel FET M14 (1317), the gate electrode of the P-channel FET M15 (1318) and the gate electrode of the P-channel FET M16 (1319), whose gate electrode is coupled with the differential input stage 1 (1301) and the differential input stage 2 (1302), and whose source electrode is coupled with the ground;

the P-channel FET M14 (1317) whose drain electrode and gate electrode are coupled with the drain electrode of the N-channel FET M13 (1316), the gate electrode of the P-channel FET M15 (1318) and the gate electrode of the P-channel FET M16 (1319), and whose source electrode is coupled with a constant current source 3;

the P-channel FET M15 (1318) whose drain electrode is coupled with the drain electrode of the N-channel FET M17

(1320), the gate electrode of the N-channel FET M17 (1320), the gate electrode of the N-channel FET M2 (1305), the gate electrode of N-channel FET M5 (1308) and the gate electrode of the N-channel FET M12 (1315), whose gate electrode is coupled with the gate electrode of the P-channel FET M16 (1319), the gate electrode of the P-channel FET M14 (1317), the drain electrode of the P-channel FET M14 (1317) and the drain electrode of the N-channel FET M13 (1316), and whose source electrode is coupled with a power source;

the P-channel FET M16 (1319) whose drain electrode is coupled with the gate electrode of the P-channel FET M1 (1304), the gate electrode of the P-channel FET M6 (1309), the gate electrode of the P-channel FET M9 (1312) and the constant current source 5 (1325), whose gate electrode is coupled with the gate electrode of the P-channel FET M15 (1318), the gate electrode of the P-channel FET M14 (1317), the drain electrode of the P-channel FET M14 (1317) and the drain electrode of the N-channel FET M13 (1316), and whose source electrode is coupled with a power source; and the N-channel FET M17 (1320) whose drain electrode and gate electrode are coupled with the gate electrode of the N-channel FET M2 (1305), the gate electrode of the N-channel FET M5 (1308), the gate electrode of the N-channel FET M12 (1315) and the drain electrode of the P-channel FET M15 (1318), and whose source electrode is coupled with the constant current source 4 (1324).

The operational amplifier according to the thirteenth embodiment of the present invention further comprises:

a constant current source 1 (CCS1) (1321) which is coupled between the differential input stage 1 (1301) and the ground;

a constant current source 2 (CCS2) (1322) which is coupled between a high potential power supply conductor VCC (1334) and the differential input stage 2 (1302);

a constant current source 3 (CCS3) (1323) which is coupled between a high potential power supply conductor VCC (1331) and the source electrode of the P-channel FET M14 (1317) differential input stage 2 (1302);

a constant current source 4 (CCS4) (1324) which is coupled between the source electrode of the N-channel FET M17 (1320) and the ground; and a constant current source 5 (CCS5) (1325) which is coupled between the drain electrode of the P-channel FET M16 (1319) and the ground.

Also, the differential input stage 1 (1301) comprises a differential transistor pair of well known art and current mirror circuits of well known art, and the differential input stage 2 (1302) comprises a differential transistor pair of well known art and a load circuit of well known art. Therefore, the circuit structures of the differential input stages are the same as those of the operational amplifier according to the first embodiment of the present invention.

Next, an explanation will be made on an operation of the operational amplifier according to the thirteenth embodiment of the present invention. A basic operation of the input stage of the operational amplifier according to the thirteenth embodiment is the same as that of operational amplifier according to the ninth embodiment. Hereinafter, an operation of the operational amplifier including the driver stage will be explained.

First, when input signals are inputted to the differential input stage 1 (1301) and the differential input stage 2 (1302) so as to raise the signal potential of the output terminal (1303), the gate electrode of the N-channel FET M13 (1316) which corresponds to an output of the differential input stages receives a falling signal.

Thereby, the gate electrodes of the P-channel FET M14 (1317), of the P-channel FET M15 (1318) and of the P-channel FET M16 (1319) receive a rising signal. Therefore, the gate electrodes of the P-channel FET M1 (1304) and of the N-channel FET M2 (1305) receive falling signals, and the potential of the output terminal (1303) rises.

Next, a consideration will be made on current quantities of the N-channel FET M3 (1306), the N-channel FET M5 (1308), the P-channel FET M9 (1312) and the P-channel FET M8 (1311), which current quantities determine current values of the differential input stages.

First, in the differential input stage 1 (1301), the current value is determined by the N-channel FET M3 (1309) and the N-channel FET M5 (1308). Since the signal potential of the gate electrode of the P-channel FET M6 (1309) falls, the current value of the P-channel FET M6 (1309) and the N-channel FET M7 (1310) increases.

That is, a current value of the N-channel FET M3 (1306) which is mirror coupled with the N-channel FET M7 (1310) also increases. Since the N-channel FET M5 (1308) receives a falling signal, a current value thereof decreases. Apparently, it is considered that, since the current value of the N-channel FET M3 (1306) increases and the current value of the N-channel FET M5 (1308) decreases, the current value of the differential input stage 1 (1301) does not vary. However, usually, the circuit is designed such that the static currents of the N-channel FET M3 (1306) and the N-channel FET M5 (1308) hardly flow therethrough. Also, when the quantity of a current increase of the N-channel FET M3 (1306) and a current decrease of the N-channel FET M5 (1308) are compared, the current increase of the N-channel FET M3 (1306) becomes larger than the current decrease of the N-channel FET M5 (1308). Therefore, the total current value of the differential input stage 1 (1301) increases.

Next, in the differential input stage 2 (1302), the current value is determined by the P-channel FET M8 (1311) and the P-channel FET M9 (1312). Since the signal potential of the gate electrode of the N-channel FET M12 (1315) falls, the current value of the N-channel FET M12 (1315) and the P-channel FET M1 (1314) decreases.

That is, a current value of the P-channel FET M8 (1311) which is mirror coupled with the P-channel FET M1 (1314) also decreases. On the other hand, since the P-channel FET M9 (1312) receives a falling signal, a current value thereof increases. Apparently, it is considered that, since the current value of the P-channel FET M9 (1312) increases and the current value of the P-channel FET M8 (1311) decreases, the current value of the differential input stage 2 (1302) does not vary. However, usually, the circuit is designed such that the static currents of the P-channel FET M9 (1312) and the P-channel FET M8 (1311) hardly flow therethrough. Also, when the quantity of a current increase of the P-channel FET M9 (1312) and a current decrease of the P-channel FET M8 (1311) are compared, the current increase of the P-channel FET M9 (1312) becomes larger than the current decrease of the P-channel FET M8 (1311). Therefore, the total current value of the differential input stage 2 (1302) increases.

From the reason mentioned above, since both the currents flowing through the differential input stage 1 (1301) and the differential input stage 2 (1302) increase, it is possible to obtain a high slew rate throughout the full operating range. Also, since the current values are increased only during the moments in which input signals change, an increase in a current consumption value becomes very small.

Figure 14:
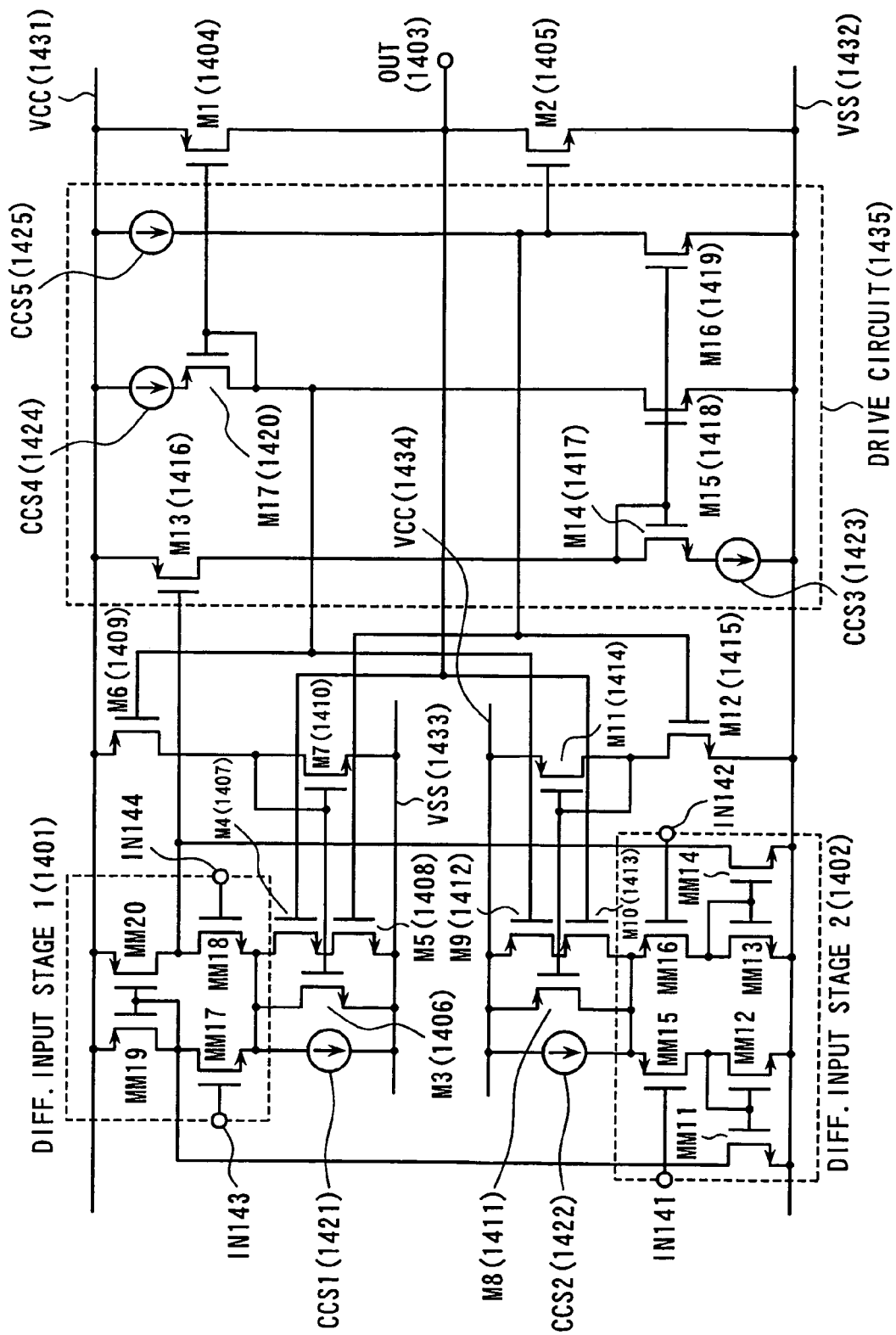
FIG. 14 is a circuit diagram showing a structure of an operational amplifier according to the foruteenth embodiment of the present invention.

FIG. 14 is a circuit diagram showing a structure of an operational amplifier according to the fourteenth embodiment of the present invention.

The operational amplifier according to the fourteenth embodiment of the present invention differs from the circuit of the operational amplifier according to the thirteenth embodiment of the present invention in that, in the operational amplifier according to the fourteenth embodiment, polarity of the circuit is reversed from that of the operational amplifier according to the thirteenth embodiment of the present invention. That is, the circuit structure of FIG. 14 is modified from the circuit structure of FIG. 13 in that P-channel FET's are changed to N-channel FET's, and N-channel FET's are changed to P-channel FET's. Also, in accordance with such changes, polarity of the constant current source circuit 1 (1421) and polarity of the constant current source circuit 2 (1422) are reversed from those of the thirteenth embodiment.

Therefore, an operation of the operational amplifier according to the fourteenth embodiment of the present invention is substantially similar to that of the operational amplifier according to the thirteenth embodiment, except that circuit polarities are reversed. Therefore, an explanation of the operation thereof is omitted here.

Figure 15:
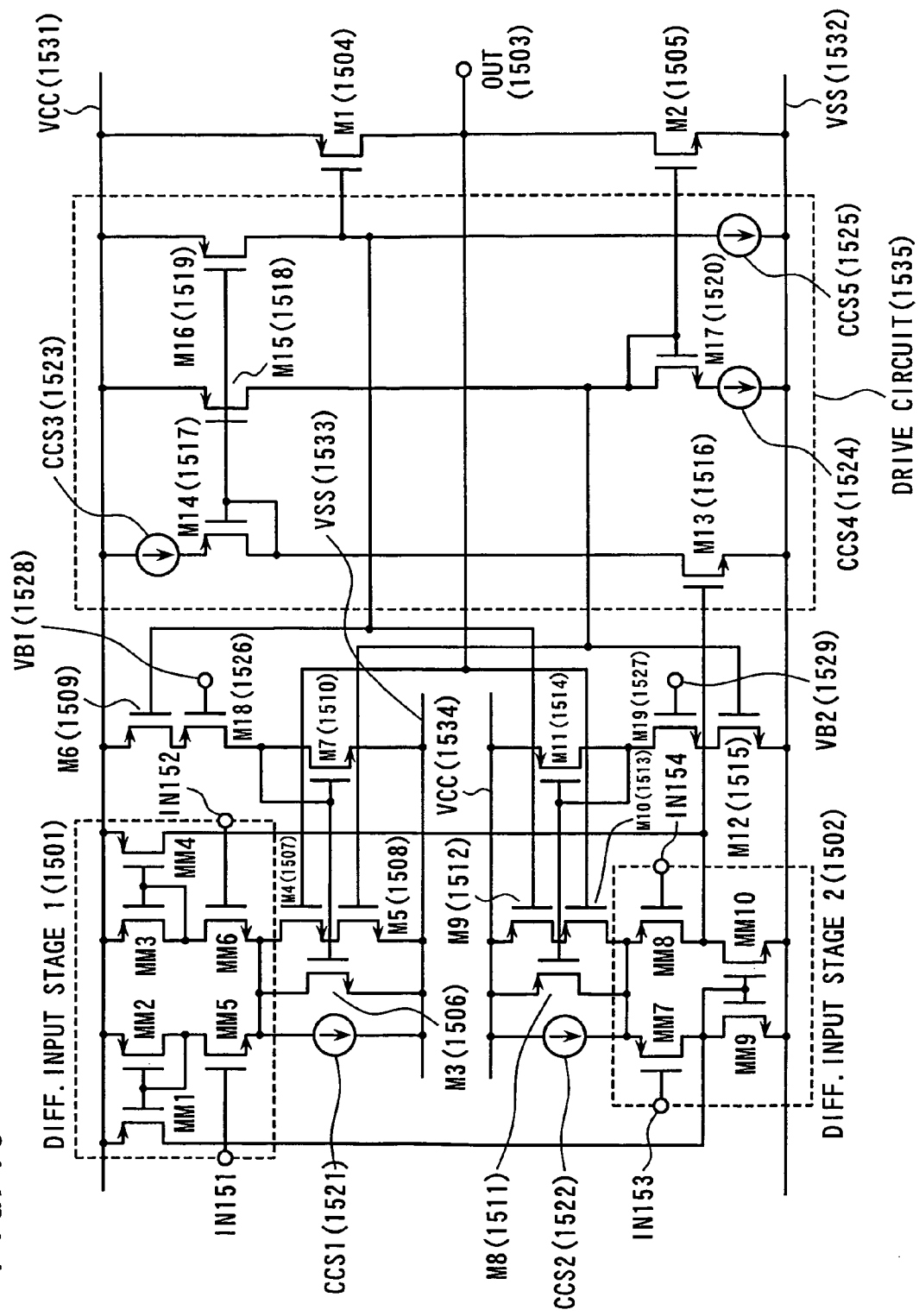
FIG. 15 is a circuit diagram showing a structure of an operational amplifier according to the fifteenth embodiment of the present invention.

FIG. 15 is a circuit diagram showing a structure of an operational amplifier according to the fifteenth embodiment of the present invention.

The operational amplifier according to the fifteenth embodiment of the present invention differs from the circuit of the operational amplifier according to the thirteenth embodiment of the present invention, i.e., the circuit of FIG. 13, in the circuit connections concerning a P-channel FET M6 (1509), a P-channel FET M18 (1526), an N-channel FET M7 (1510), an N-channel FET M3 (1506), a P-channel FET M8 (1511), a P-channel FET M11 (1514), an N-channel FET M19 (1527) and an N-channel FET M12 (1515).

Other portions and connections in FIG. 15 concerning a differential input stage 1 (1501), a differential input stage 2 (1502), an output terminal (1503), a P-channel FET M1 (1504), an N-channel FET M2 (1505), an N-channel FET M4 (1507), an N-channel FET M5 (1508), a P-channel FET M9 (1512), a P-channel FET M10 (1513), an N-channel FET M13 (1516), a P-channel FET M14 (1517), a P-channel FET M15 (1518), a P-channel FET M16 (1519), an N-channel FET M17 (1520), a constant current source 1 (1521), a constant current source 2 (1522), a constant current source 3 (1523), a constant current source 4 (1524) and a constant current source 5 (1525) are the same as those concerning differential input stage 1 (1301), a differential input stage 2 (1302), an output terminal (130.3), a P-channel FET M1 (1304), an N-channel FET M2 (1305), an N-channel FET M4 (1307), an N-channel FET M5 (1308), a P-channel FET M9 (1312), a P-channel FET M10 (1313), an N-channel FET M13 (1316), a P-channel FET M14 (1317), a P-channel FET M15 (1318), a P-channel FET M16 (1319), an N-channel FET M17 (1320), a constant current source 1 (1321), a constant current source 2 (1322), a constant current source 3 (1323), a constant current source 4 (1324) and a constant current source 5 (1325) of the operational amplifier according to the thirteenth embodiment of the present invention shown in FIG. 13, respectively.

An explanation will be made mainly on portions of FIG. 15 which have different connections from those of FIG. 13 and which include the P-channel FET M6 (1509), the P-channel FET M18 (1526), the N-channel FET M7 (1510), the N-channel FET M3 (1506), the P-channel FET M8 (1511), the P-channel FET M11 (1514), the N-channel FET M19 (1527) and the N-channel FET M12 (1515).

That is, the operational amplifier according to the fifteenth embodiment shown in FIG. 15 comprises:

the P-channel FET M6 (1509) whose drain electrode is coupled with the source electrode of the P-channel FET M18 (1526), whose gate electrode is coupled with the gate electrode of the P-channel FET M9 (1512), the drain electrode of the P-channel FET M16 (1519), the gate electrode of the P-channel FET M1 (1504), and the constant current source 1 (1525), and whose source electrode is coupled with a power source;

the P-channel FET M18 (1526) whose drain electrode is coupled with the drain electrode of the N-channel FET M7 (1510), the gate electrode of the N-channel FET M7 (1510), and the gate electrode of the N-channel FET M3 (1506), whose gate electrode is coupled with a predetermined voltage 1 (1528), and whose source electrode is coupled with the drain electrode of the P-channel FET M6 (1509);

the N-channel FET M7 (1510) whose drain electrode and gate electrode are coupled with the drain electrode of the P-channel FET M18 (1526), and the gate electrode of the N-channel FET M3 (1506), and whose source electrode is coupled with the ground;

the N-channel FET M3 (1506) whose drain electrode is coupled with the differential input stage 1 (1501), whose gate electrode is coupled with the gate electrode of the N-channel FET M7 (1510), the drain electrode of the N-channel FET M7 (1510), and the drain electrode of the P-channel FET M18 (1526), and whose source electrode is coupled with the ground;

the P-channel FET M8 (1511) whose drain electrode is coupled with the differential input stage 2 (1502), whose gate electrode is coupled with the gate electrode of the P-channel FET M11 (1514), the drain electrode of the P-channel FET M11 (1514), and the drain electrode of the N-channel FET M19 (1527), and whose source electrode is coupled with a power source;

the P-channel FET M11 (1514) whose drain electrode and gate electrode are coupled with the gate electrode of the P-channel FET M8 (1511), and the drain electrode of the N-channel FET M19 (1527), and whose source electrode is coupled with the power source;

the N-channel FET M19 (1527) whose drain electrode is coupled with the drain electrode of the P-channel FET M11 (1514), the gate electrode of the P-channel FET M11 (1514), and the gate electrode of the P-channel FET M8 (1511), whose gate electrode is coupled with a predetermined voltage 2 (1529), and whose source electrode is coupled with the drain electrode of the N-channel FET M12 (1515); and the N-channel FET M12 (1515) whose drain electrode is coupled with the source electrode of the N-channel FET M19 (1527), whose gate electrode is coupled with the gate electrode of the N-channel FET M5 (1508), the drain electrode of the P-channel FET M15 (1518), the drain electrode of the N-channel FET M17 (1520), the gate electrode of the N-channel FET M17 (1520), and the gate electrode of the N-channel FET M2 (1505), and whose source electrode is coupled with the ground.

In addition to the above-mentioned portions, the operational amplifier according to the fifteenth embodiment of the present invention comprises: the above-mentioned differential input stage 1 (1501), the differential input stage 2 (1502), the output terminal (1503), the P-channel FET M1 (1504), the N-channel FET M2 (1505), the N-channel FET M4 (1507), the N-channel FET M5 (1508), the P-channel FET M9 (1512), the P-channel FET M10 (1513), the N-channel FET M13 (1516), the P-channel FET M14 (1517), the P-channel FET M15 (1518), the P-channel FET M16 (1519), the N-channel FET M17 (1520), the constant current source 1 (1521), the constant current source 2 (1522), the constant current source 3 (1523), the constant current source 4 (1524), and the constant current source 5 (1525).

Also, the differential input stage 1 (1501) comprises a differential transistor pair of well known art and current mirror circuits of well known art, and the differential input stage 2 (1502) comprises a differential transistor pair of well known art and a load circuit of well known art. Therefore, the circuit structures of the differential input stages are the same as those of the operational amplifier according to the first embodiment of the present invention.

Next, an explanation will be made on an operation of the operational amplifier according to the fifteenth embodiment of the present invention. A basic operation of the input stage of the operational amplifier according to the fifteenth embodiment is the same as that of operational amplifier according to the thirteenth embodiment. Hereinafter, an operation of the newly added P-channel FET M18 (1526) and the N-channel FET M19 (1527) will be mainly explained.

In the operational amplifier according to the fifteenth embodiment of the present invention, when rising or falling signals are inputted to the differential input stage 1 (1501) and the differential input stage 2 (1502), there is a possibility that a large current flows through the P-channel FET M6 (1509) or the N-channel FET M12 (1515), as mentioned in the description on the operation of the operational amplifier according to the thirteenth embodiment. Therefore, in order to suppress such large current, the predetermined voltage 1 (VB1) (1528) is applied to the gate electrode of the P-channel FET M18 (1526) and the predetermined voltage 2 (VB2) (1529) is applied to the gate electrode of the N-channel FET M19 (1527), such that the P-channel FET M18 (1526) and the N-channel FET M19 (1527) function as constant current sources and the current is suppressed to become under a predetermined value. Thereby, it is possible to appropriately control the current value.

Figure 16:
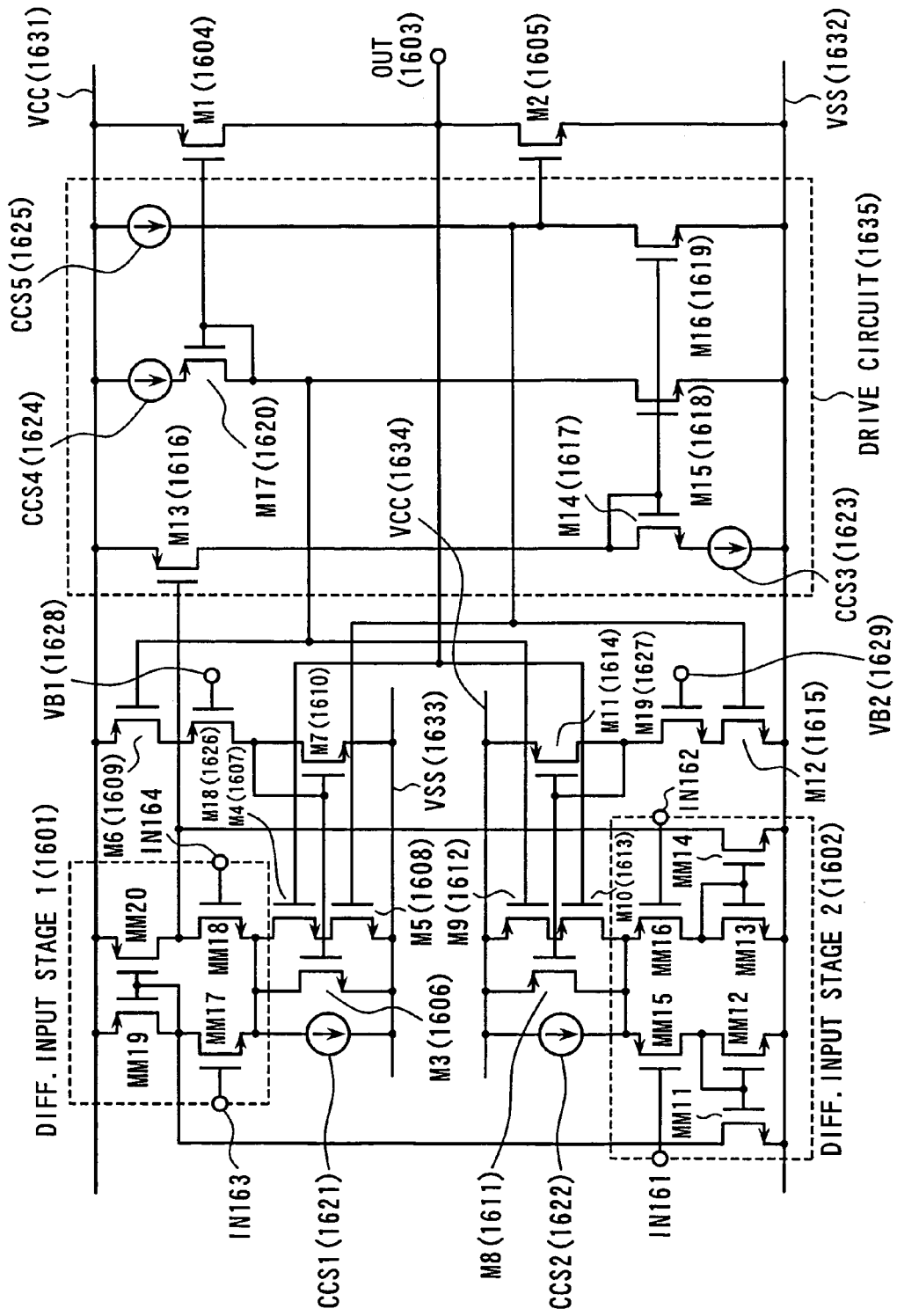
FIG. 16 is a circuit diagram showing a structure of an operational amplifier according to the sixteenth embodiment of the present invention.

FIG. 16 is a circuit diagram showing a structure of an operational amplifier according to the sixteenth embodiment of the present invention.

The operational amplifier according to the sixteenth embodiment of the present invention differs from the circuit of the operational amplifier according to the fifteenth embodiment of the present invention in that, in the operational amplifier according to the sixteenth embodiment, polarity of the circuit is reversed from that of the operational amplifier according to the fifteenth embodiment of the present invention. That is, the circuit structure of FIG. 16 is modified from the circuit structure of FIG. 15 in that P-channel FET's are changed to N-channel FET's, and N-channel FET's are changed to P-channel FET's. Also, in accordance with such changes, polarity of the constant current source circuit 1 (1621) and polarity of the constant current source circuit 2 (1622) are reversed from those of the fifteenth embodiment.

Therefore, an operation of the operational amplifier according to the sixteenth embodiment of the present invention is substantially similar to that of the operational amplifier according to the fifteenth embodiment, except that circuit polarities are reversed. Therefore, an explanation of the operation thereof is omitted here.

Figure 17:
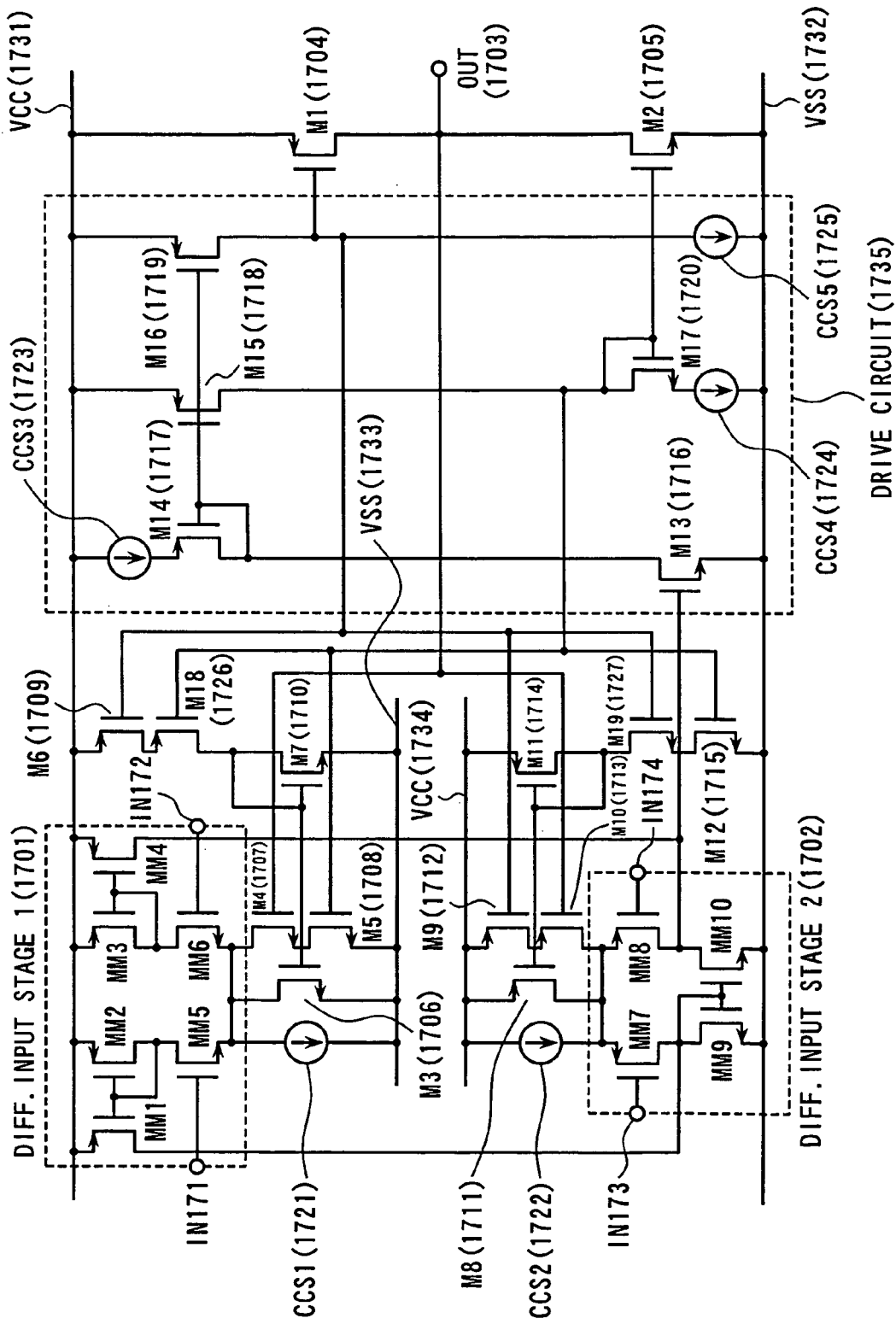
FIG. 17 is a circuit diagram showing a structure of an operational amplifier according to the seventeenth embodiment of the present invention.

FIG. 17 is a circuit diagram showing a structure of an operational amplifier according to the seventeenth embodiment of the present invention.

The circuit structure of the operational amplifier according to the seventeenth embodiment of the present invention is substantially the same as that of the operational amplifier according to the fifteenth embodiment of the present invention except for the following.

That is, the operational amplifier shown in FIG. 17 differs from the operational amplifier shown in FIG. 15 in the connections of the gate electrode of the P-channel FET M18 (1726) and of the gate electrode of the N-channel FET M19 (1727). In the operational amplifier according to the fifteenth embodiment, the gate electrodes of these transistors are coupled with predetermined voltages. However, in FIG. 17, the gate electrode of the P-channel FET M18 (1726) is coupled with the gate electrode of the N-channel FET M5 (1708), the gate electrode of the N-channel FET M12 (1715), the gate electrode of the N-channel FET M17 (1720), the drain electrode of the N-channel FET M17 (1720), the gate electrode of the N-channel FET M2 (1705) and the drain electrode of the P-channel FET M15 (1718). Also, the gate electrode of the N-channel FET M19 (1727) is coupled with the gate electrode of the P-channel FET M6 (1709), the gate electrode of the P-channel FET M9 (1712), the drain electrode of the P-channel FET M16 (1719) and the gate electrode of the P-channel FET M1 (1704) and the constant current source 5 (1725).

Connections of other elements of the operational amplifier shown in FIG. 17 are the same as those of other elements of the operational amplifier according to the fifteenth embodiment shown in FIG. 15.

With respect to an operation of the operational amplifier according to the seventeenth embodiment of the present invention, the P-channel FET M18 (1726) and the N-channel FET M19 (1727) in the operational amplifier according to the seventeenth embodiment function similarly to the P-channel FET M18 (1526) and the N-channel FET M19 (1527) in the operational amplifier according to the fifteenth embodiment, respectively, and function to prevent penetrating currents from flowing through the P-channel FET M6 (1704) and the N-channel FET M12 (1715). Therefore, a detailed explanation of the operation thereof is omitted here.

Figure 18:
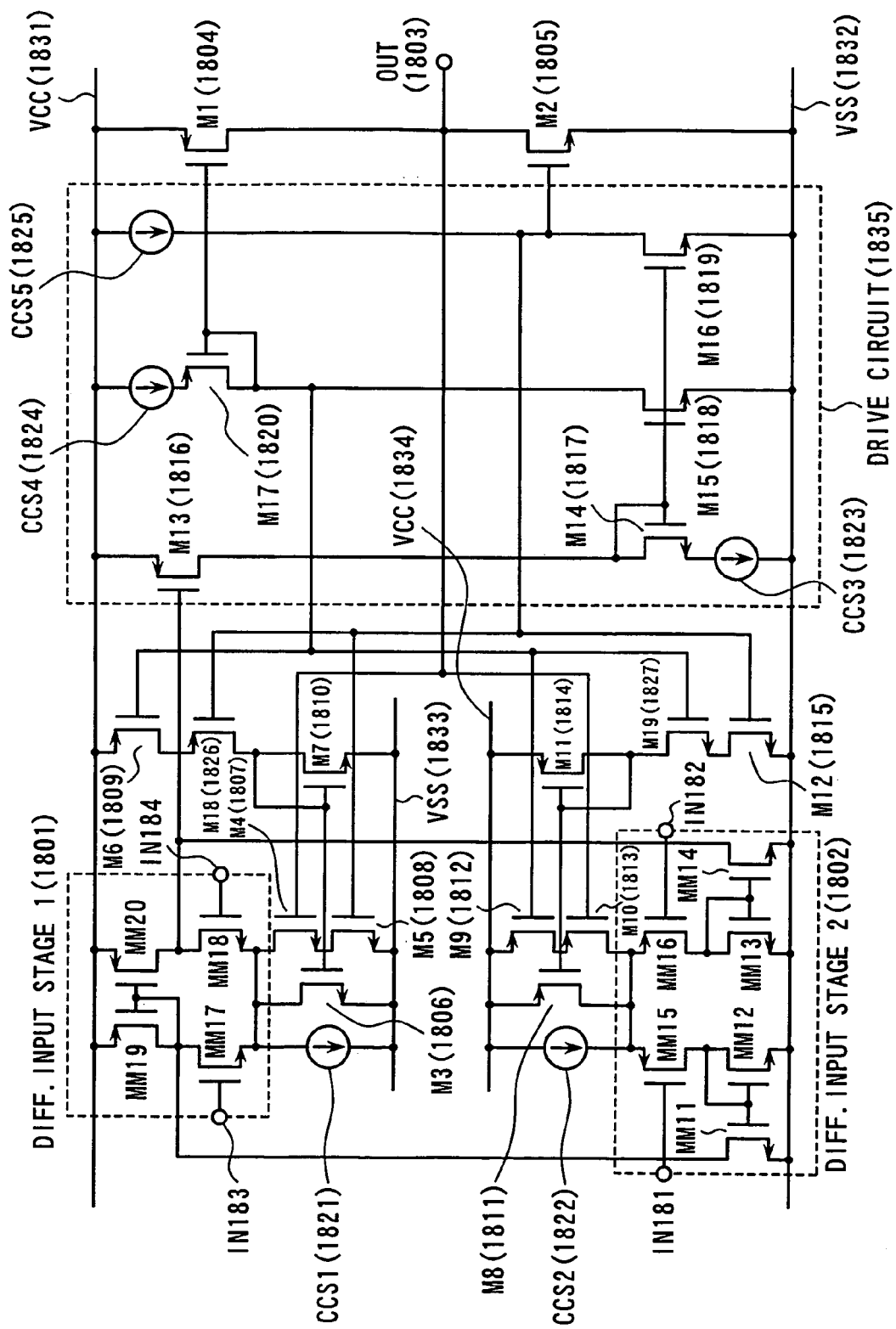
FIG. 18 is a circuit diagram showing a structure of an operational amplifier according to the eighteenth embodiment of the present invention.

FIG. 18 is a circuit diagram showing a structure of an operational amplifier according to the eighteenth embodiment of the present invention.

The operational amplifier according to the eighteenth embodiment of the present invention differs from the circuit of the operational amplifier according to the seventeenth embodiment of the present invention in that, in the operational amplifier according to the eighteenth embodiment, polarity of the circuit is reversed from that of the operational amplifier according to the seventeenth embodiment of the present invention. That is, the circuit structure of FIG. 18 is modified from the circuit structure of FIG. 17 in that P-channel FET's are changed to N-channel FET's, and N-channel FET's are changed to P-channel FET's. Also, in accordance with such changes, polarity of the constant current source circuit 1 (1821) and polarity of the constant current source circuit 2 (1822) are reversed from those of the seventeenth embodiment.

Therefore, an operation of the operational amplifier according to the eighteenth embodiment of the present invention is substantially similar to that of the operational amplifier according to the seventeenth embodiment, except that circuit polarities are reversed. Therefore, an explanation of the operation thereof is omitted here.

FIG. 20A through FIG. 20C show comparison results of various performance parameters including slew rates and current values between the conventional operational amplifier shown in FIG. 19 and the operational amplifier according to the present invention shown in FIG. 15. In these drawings, Vt designates a threshold value of the transistors constituting an operational amplifier. Vt=H means that the threshold value is the highest value within a predetermined specification, Vt=C means that the threshold value is approximately the central value within the predetermined specification, and Vt=L means that the threshold value is the lowest value within the predetermined specification. SUT means a rising time, and SDT means a falling time. From FIG. 20A through FIG. 20C, it is apparent that the operational amplifier according to the present invention provides performance far superior to that of the conventional operational amplifier, although static consumption currents and dynamic or operating consumption currents slightly increase.

Figure 21:
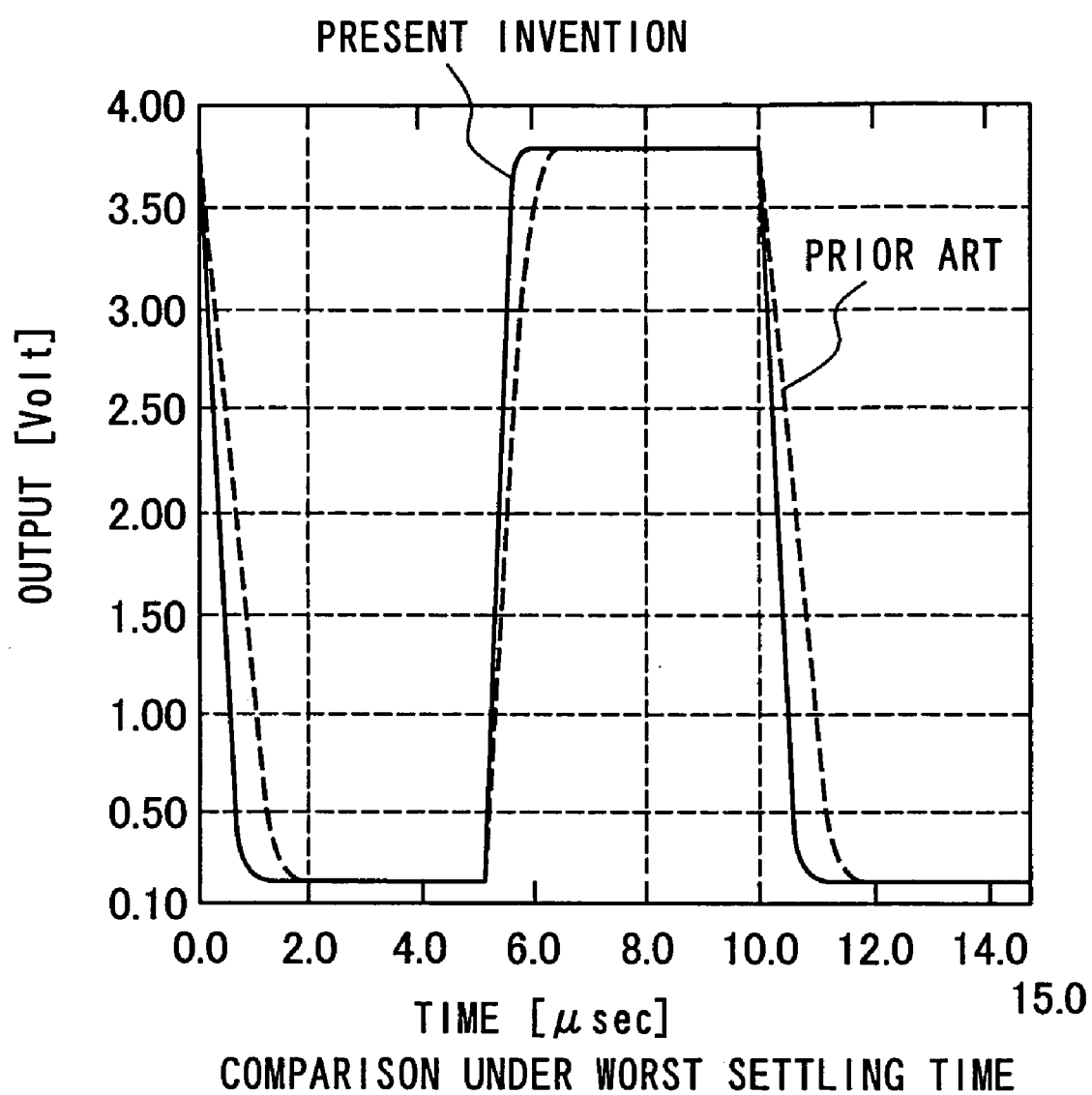
FIG. 21 is a waveform diagram showing signal waveforms of the operational amplifier according to the present invention and of the conventional operational amplifier.

Also, FIG. 21 shows comparison results of output signal waveforms of the operational amplifiers between the prior art and the present invention, under the worst condition in which the threshold value of transistors is the highest value within the predetermined specification.

In the operational amplifier according to the above-mentioned embodiments, field effect transistors are used wherein the first electrode is the source electrode, the second electrode is the gate electrode, and the third electrode is the drain electrode. However, in the operational amplifier according to the present invention, it is also possible to use bipolar transistors, wherein the first electrode is the emitter electrode, the second electrode is the base electrode, and the third electrode is the collector electrode.

According to the present invention, current values of the differential input stage which receives input signals by P-channel FET's and the differential input stage which receives input signals by N-channel FET's are increased without using external signals. Therefore, it is not necessary to provide an external control circuit, and it is possible to obtain a high slew rate throughout the full operating range. Also, current values of the input stages are increased only at varying portions of input signals of the operational amplifier and, therefore, the consumption current value hardly increases, when compared with that of the prior art operational amplifier.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative sense rather than a restrictive sense, and all such modifications are to be included within the scope of the present invention. Therefore, it is intended that this invention encompasses all of the variations and modifications as falling within the scope of the appended claims.

What is claimed is:

1. An operational amplifier comprising:
   a first input terminal and a second input terminal;
   a first differential transistor pair of a first conductivity type and a second differential transistor pair of a second conductivity type which is different from the first conductivity type, each of the second electrodes, i.e., control electrodes, of transistors of the first and second differential transistor pairs being coupled with the first input terminal or the second input terminal;
   a first current mirror circuit which is coupled with one output of the first differential transistor pair, with one output of the second differential transistor pair, and with a first power supply conductor;
   a second current mirror circuit which is coupled with the other output of the first differential transistor pair, with the other output of the second differential transistor pair, and with the first power supply conductor;
   a load circuit (MM9, MM10) which is coupled between the second differential transistor pair and a second power supply conductor;
   an output driver stage circuit which is coupled with the coupling node between the first current mirror circuit and the load circuit, and which has two drive output terminals for controlling first and second output transistors;
   the first transistor whose second electrode, i.e., control electrode, is coupled with one of the two drive output terminals of the output drive circuit, whose first and third electrodes are coupled with the first power supply conductor and an output terminal of the operational amplifier, respectively;
   the second transistor whose second electrode, i.e., control electrode is coupled with the other of the two drive output terminals of the output drive circuit, whose first and third electrodes are coupled with the second power supply conductor and the output terminal of the operational amplifier, respectively;
   first and second current source circuits which are coupled with the first and second differential transistor pairs, respectively, and which are controlled by the output drive signals of the output driver stage circuit;
   a first phase inverter circuit which responds to a drive output potential level of the output driver stage circuit and which controls a circuit current of the first differential transistor pair in response to the rise or fall of the signal output potential level; and
   a second phase inverter circuit which responds to the drive output potential level of the output driver stage circuit and which controls a circuit current of the second differential transistor pair in response to the fall or rise of the signal output potential level.

2. An operational amplifier as set forth in claim 1, wherein the first current source circuit comprises:
   a third transistor whose second electrode, i.e., control electrode, is coupled with the first phase inverter circuit, and whose first and third electrodes are coupled with the second power supply conductor and the first differential transistor pair, respectively; and
   a third current source circuit which is coupled with the first differential transistor pair, the second power supply conductor, the output terminal of the operational amplifier, and the second electrode, i.e., control electrode, of the second transistor; and
   wherein the second current source circuit comprises:
   a fourth transistor whose second electrode, i.e., control electrode, is coupled with the second phase inverter circuit, and whose first and third electrodes are coupled with the first power supply conductor and the second differential transistor pair, respectively; and
   a fourth current source circuit which is coupled with the second differential transistor pair, the first power supply conductor, the output terminal of the operational amplifier, and the second electrode, i.e., control electrode, of the first transistor.

3. An operational amplifier as set forth in claim 1, further comprising first and second constant current source circuits which are coupled parallel to the first and second current source circuits, respectively.

4. An operational amplifier as set forth in claim 2, wherein the third current source circuit comprises fifth and sixth transistors, the fifth transistor having the third electrode coupled with the first differential transistor pair, the second electrode, i.e., control electrode, coupled with the output terminal of the operational amplifier, and the first electrode coupled with the third electrode of the sixth transistor, and the sixth transistor having the third electrode coupled with the first electrode of the fifth transistor, the second electrode, i.e., control electrode, coupled with the second electrode of the second transistor, and the first electrode coupled with the second power supply conductor, and wherein the fourth current source circuit comprises seventh and eighth transistors, the seventh transistor having the third electrode coupled with the second differential transistor pair, the second electrode, i.e., control electrode, coupled with the output terminal of the operational amplifier, and the first electrode coupled with the third electrode of the eighth transistor, and the eighth transistor having the third electrode coupled with the first electrode of the seventh transistor, the second electrode, i.e., control electrode, coupled with the second electrode of the first transistor, and the first electrode coupled with the first power supply conductor.

5. An operational amplifier as set forth in claim 2, wherein the first phase inverter circuit comprises ninth, tenth and eleventh transistors, the ninth transistor having the third electrode coupled with the first electrode of the tenth transistor, the second electrode coupled with the second electrode of the first transistor, and the first electrode coupled with the first power supply conductor, the tenth transistor having the third electrode coupled with the second and third electrodes of the eleventh transistor and with the second electrode of the third transistor, the second electrode coupled with a first predetermined voltage, and the first electrode coupled with the third electrode of the ninth electrode, and the eleventh transistor having the second and third electrodes coupled with the third electrode of the tenth transistor and with the second electrode of the third transistor, and the first electrode coupled with the second power supply conductor; and wherein the second phase inverter circuit comprises twelfth, thirteenth and fourteenth transistors, the twelfth transistor having the second and third electrodes coupled with the third electrode of the thirteenth transistor and with the second electrode of the fourth transistor, and the first electrode coupled with the first power supply conductor, the thirteenth transistor having the third electrode coupled with the second and third electrodes of the twelfth transistor and with the second electrode of the fourth transistor, the second electrode coupled with a second predetermined voltage, and the first electrode coupled with the third electrode of the fourteenth electrode, and the fourteenth transistor having the third electrode coupled with the first electrode of the thirteenth transistor, the second electrode coupled with the second electrode of the second transistor, and the first electrode coupled with the second power supply conductor.

6. An operational amplifier as set forth in claim 2, wherein the output driver stage circuit comprises fifteenth, sixteenth, seventeenth, eighteenth and nineteenth transistors, and third, fourth and fifth constant current source circuits, the fifteenth transistor having the third electrode coupled with the second electrodes of the sixteenth, seventeenth and eighteenth transistors and with the third electrode of the sixteenth transistor, the second electrode coupled with the first current mirror circuit and with the load circuit, and the first electrode coupled with the second power supply conductor, the sixteenth transistor having the second and third electrodes both coupled with the second electrodes of the seventeenth and eighteenth transistors and with the third electrode of the fifteenth transistor, and the first electrode coupled with the third constant current source circuit, the seventeenth transistor having the third electrode coupled with the second and third electrodes of the nineteenth transistor, with the second electrode of the second transistor, with the second electrode of the sixth transistor and with the second electrode of the fourteenth transistor, the second electrode coupled with the second electrodes of the sixteenth and eighteenth transistors and with the third electrode of the sixteenth and fifteenth transistors, and the first electrode coupled with the first power supply conductor, the eighteenth transistor having the third electrode coupled with the fifth constant current source, with the second electrode of the first transistor, with the second electrode of the seventh transistor and with the second electrode of the ninth transistor, the second electrode coupled with the second electrodes of the sixteenth and seventeenth transistors, and with the third electrodes of the fifteenth and sixteenth transistors, and the first electrode coupled with the first power supply conductor, the nineteenth transistor having the second and third electrodes coupled with the second electrode of the first transistor, with the second electrode of the sixth transistor, with second electrode of the fourteenth transistor, and with the third electrode of the seventeenth transistor, the first electrode coupled with the fourth constant current source circuit, the third constant current source circuit being coupled between the first power supply conductor and the first electrode of the fifteenth transistor, the fourth constant current source circuit being coupled between the second power supply conductor and the first electrode of the nineteenth transistor, and the fifth constant current source circuit being coupled between the second power supply conductor and the third electrode of the eighteenth transistor.

7. An operational amplifier as set forth in claim 1, wherein the transistors are field effect transistors each of which has the source electrode as the first electrode, the gate electrode as the second electrode and the drain electrode as the third electrode.

8. An operational amplifier as set forth in claim 1, wherein the transistors are bipolar transistors each of which has the emitter electrode as the first electrode, the base electrode as the second electrode and the collector electrode as the third electrode.

* * * * *